United States Patent
Su et al.

(10) Patent No.: US 11,031,055 B2
(45) Date of Patent: *Jun. 8, 2021

(54) MEMORY MACRO AND METHOD OF OPERATING THE SAME

(71) Applicant: TAIWAN SEMICONDUCTOR MANUFACTURING COMPANY, LTD., Hsinchu (TW)

(72) Inventors: Chien-Kuo Su, Luzhu Township (TW); Cheng Hung Lee, Hsinchu (TW); Chiting Cheng, Taichung (TW); Hung-Jen Liao, Hsinchu (TW); Jonathan Tsung-Yung Chang, Hsinchu (TW); Yen-Huei Chen, Jhudong Township (TW); Pankaj Aggarwal, Zhudong Township (TW); Jhon Jhy Liaw, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/783,915

(22) Filed: Feb. 6, 2020

(65) Prior Publication Data

US 2020/0176037 A1 Jun. 4, 2020

Related U.S. Application Data

(63) Continuation of application No. 16/404,463, filed on May 6, 2019, now Pat. No. 10,559,333, which is a
(Continued)

(51) Int. Cl.
*G11C 7/00* (2006.01)
*G11C 7/12* (2006.01)
(Continued)

(52) U.S. Cl.
CPC .............. *G11C 7/12* (2013.01); *G11C 7/227* (2013.01); *G11C 11/419* (2013.01)

(58) Field of Classification Search
CPC ......... G11C 7/12; G11C 11/4094; G11C 7/22; G11C 1/1048; G11C 11/4091
(Continued)

(56) References Cited

U.S. PATENT DOCUMENTS

| 8,605,523 | B2 | 12/2013 | Tao et al. |
| 8,630,132 | B2 | 1/2014 | Cheng et al. |

(Continued)

FOREIGN PATENT DOCUMENTS

| CN | 203118487 | 8/2013 |
| CN | 103456346 | 12/2013 |
| TW | 200710871 | 3/2007 |

OTHER PUBLICATIONS

Office Action dated Nov. 5, 2019 from corresponding application No. CN 201710182966.5.

*Primary Examiner* — Son T Dinh
(74) *Attorney, Agent, or Firm* — Hauptman Ham, LLP

(57) ABSTRACT

A memory macro includes a first memory cell array, a first tracking circuit, a first and a second transistor. The first tracking circuit includes a first set of memory cells configured as a first set of loading cells responsive to a first control signal, a second set of memory cells configured as a first set of pull-down cells responsive to a second control signal, and a first tracking bit line extending over the first tracking circuit. The second control signal is inverted from the first control signal. At least the first set of pull-down cells or the first set of loading cells is configured to track a memory cell of the first memory cell array. The first and second transistor are coupled to the first tracking bit line, and are configured (Continued)

to charge the first tracking bit line to a pre-charge voltage level responsive to a third control signal.

20 Claims, 16 Drawing Sheets

Related U.S. Application Data continuation of application No. 16/005,121, filed on Jun. 11, 2018, now Pat. No. 10,319,421, which is a continuation of application No. 15/798,710, filed on Oct. 31, 2017, now Pat. No. 9,997,219, which is a continuation of application No. 15/434,541, filed on Feb. 16, 2017, now Pat. No. 9,824,729.

(60) Provisional application No. 62/313,585, filed on Mar. 25, 2016.

(51) Int. Cl.
*G11C 7/22* (2006.01)
*G11C 11/419* (2006.01)

(58) Field of Classification Search
USPC .................................................. 365/203, 63
See application file for complete search history.

(56) References Cited

U.S. PATENT DOCUMENTS

| | | |
|---|---|---|
| 8,760,948 B2 | 6/2014 | Tao et al. |
| 8,908,421 B2 | 12/2014 | Liaw |
| 8,929,160 B2 | 1/2015 | Katoch et al. |
| 8,964,492 B2 | 2/2015 | Hsu et al. |
| 8,982,643 B2 | 3/2015 | Lum |
| 9,117,510 B2 | 8/2015 | Yang et al. |
| 9,208,858 B1 | 12/2015 | Lin et al. |
| 9,218,872 B1 | 12/2015 | Liaw |
| 9,236,128 B1 | 1/2016 | Louie |
| 9,824,729 B2 | 11/2017 | Su |
| 9,830,964 B2 | 11/2017 | Bartling et al. |
| 9,997,219 B2 | 6/2018 | Su |
| 10,559,333 B2 * | 2/2020 | Su .......................... G11C 7/227 |
| 2008/0181033 A1 | 7/2008 | Clinton |
| 2010/0124098 A1 | 5/2010 | Zhang et al. |
| 2014/0050038 A1 | 2/2014 | Chen et al. |
| 2014/0075087 A1 | 3/2014 | Bartling et al. |
| 2014/0153345 A1 | 6/2014 | Kim et al. |
| 2014/0233330 A1 | 8/2014 | Ko et al. |
| 2014/0241077 A1 | 8/2014 | Katoch et al. |
| 2015/0078110 A1 | 3/2015 | Hong et al. |
| 2015/0348598 A1 | 12/2015 | Wang et al. |
| 2015/0371702 A1 | 12/2015 | Wu et al. |
| 2015/0380077 A1 | 12/2015 | Wu et al. |
| 2015/0380078 A1 | 12/2015 | Liaw |

\* cited by examiner

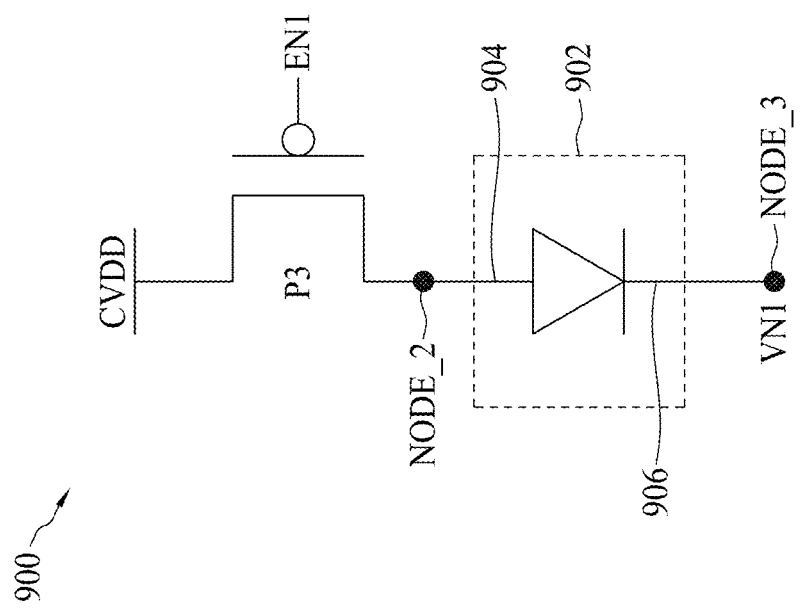

MEMORY MACRO AND METHOD OF OPERATING THE SAME

PRIORITY CLAIM

The present application is a continuation of U.S. application Ser. No. 16/404,463, filed May 6, 2019, now U.S. Pat. No. 10,559,333, issued February Jun. 11, 2020, which is a continuation of U.S. application Ser. No. 16/005,121, filed Jun. 11, 2018, now U.S. Pat. No. 10,319,421, issued Jun. 11, 2019, which is a continuation of U.S. application Ser. No. 15/798,710, filed Oct. 31, 2017, now U.S. Pat. No. 9,997,219, issued Jun. 12, 2018, which is a continuation of U.S. application Ser. No. 15/434,541, filed Feb. 16, 2017, now U.S. Pat. No. 9,824,729, issued Nov. 21, 2017, which claims the priority of U.S. Provisional Application No. 62/313,585, filed Mar. 25, 2016, the disclosures of which are incorporated herein by reference in their entireties.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, operating voltages of these digital devices continue to decrease affecting IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a circuit diagram of a retention circuit, in accordance with some embodiments.

DETAILED DESCRIPTION

Figure 1:
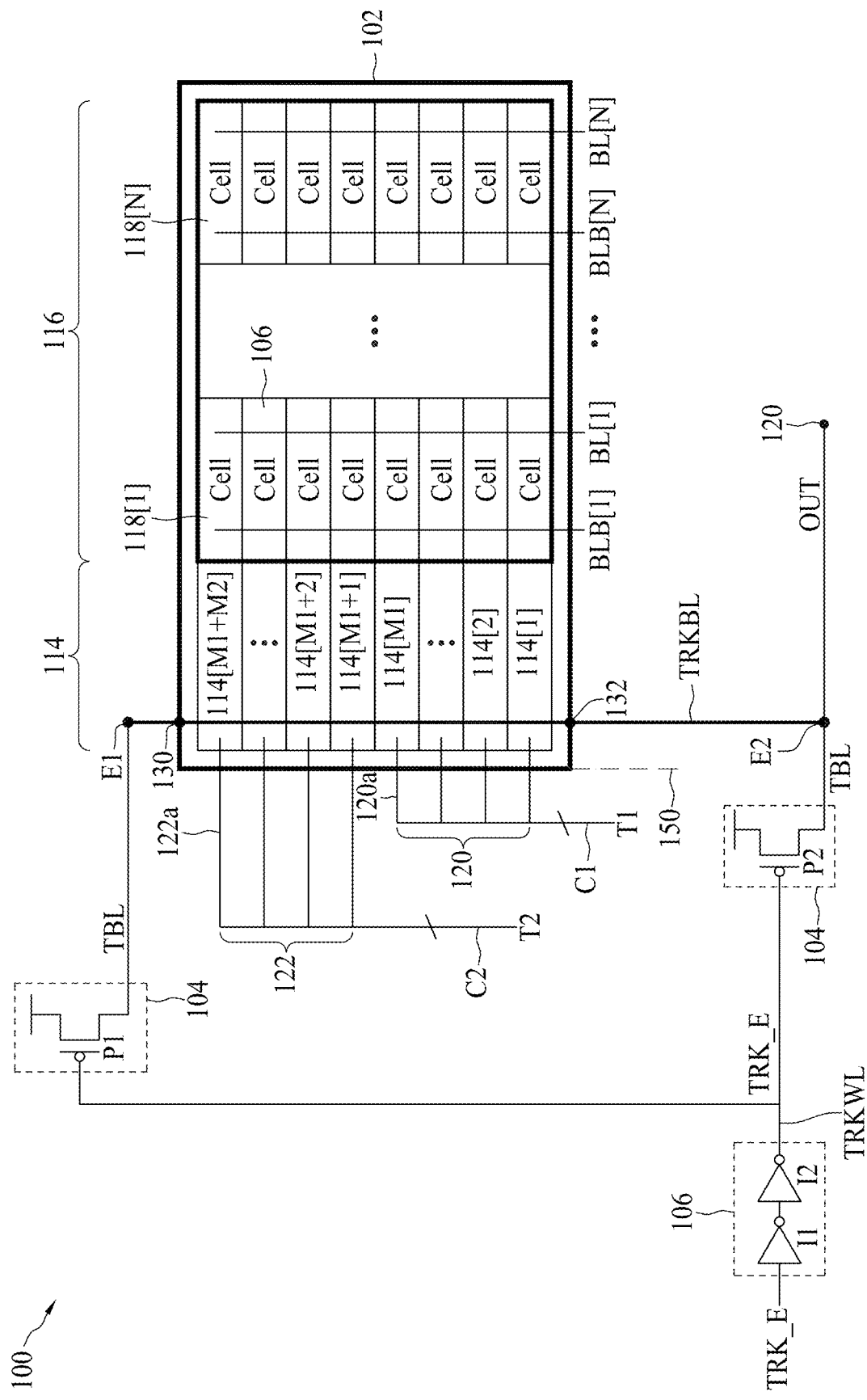
FIG. 1 is a circuit diagram of a memory macro, in accordance with some embodiments.

The following disclosure provides different embodiments, or examples, for implementing features of the provided subject matter. Specific examples of components, materials, values, steps, arrangements, etc., are described below to simplify the present disclosure. These are, of course, merely examples and are not limiting. Other components, materials, values, steps, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory macro includes a first memory cell array, a first tracking circuit and a first pre-charge circuit. The first tracking circuit includes a first set of memory cells configured as a first set of loading cells responsive to a first set of control signals, a second set of memory cells configured as a first set of pull-down cells responsive to a second set of control signals, and a first tracking bit line coupled to the first set of memory cells and the second set of memory cells. The first set of pull-down cells and the first set of loading cells are configured to track a memory cell of the first memory cell array. The first pre-charge circuit is coupled to the first tracking bit line. The first pre-charge circuit is configured to charge the first tracking bit line to a pre-charge voltage level responsive to a third set of control signals. In some embodiments, the first pre-charge circuit is coupled to opposite ends of the first tracking bit line yielding a memory macro that has less electro-migration in the first tracking bit line than other memory macro circuits. In some embodiments, a number of cells in the first set of pull-down cells and a number of cells in the first set of loading cells is dynamically adjusted and yields a more flexible memory macro than other memory macro circuits.

FIG. 1 is a circuit diagram of a memory macro 100, in accordance with some embodiments. In the embodiment of FIG. 1, memory macro 100 is a static random access memory (SRAM) macro. SRAM is used for illustration, and other types of memories are within the scope of various embodiments.

Memory macro 100 comprises a first memory array 102 coupled to a first pre-charge circuit 104. Memory macro 100 further comprises the first pre-charge circuit 104 being coupled to a first tracking word line TRKWL and a first tracking word line driver 106.

First memory array 102 comprises a first tracking circuit 114 and a first memory cell array 116. In some embodiments, first memory array 102 corresponds to a memory bank. In some embodiments, memory macro 100 also includes edge cells (not shown) configured to surround or enclose the perimeter of first memory cell array 116.

First tracking circuit 114 is coupled to first pre-charge circuit 104. First tracking circuit 114 is configured to track a word line signal or a bit line/bit line bar signal of first memory cell array 116 during a read or write operation of a memory cell of the memory cell array 116. First tracking circuit 114 comprises a first tracking bit line TRKBL coupled to a first set of memory cells 114[1], . . . , 114[M1] (collectively referred to as "first set of memory cells 120") and a second set of memory cells 114[M1+1], . . . , 122[M1+M2] (collectively referred to as "second set of memory cells 122"), where M1 is an integer corresponding to the number of rows in the first set of memory cells 120, and M2 is an integer corresponding to the number of rows in the second set of memory cells 122. Each cell of the first set of memory cells 120 or each cell of the second set of memory cells is a tracking cell. The number of rows M1 in the first set of memory cells 120 is equal to or greater than 1. The number of rows M2 in the second set of memory cells 122 is equal to or greater than 1.

The first tracking bit line TRKBL is configured to carry a tracking bit line signal TBL having a voltage level. The first tracking bit line TRKBL has a first terminal 130 and a second terminal 132. First terminal 130 is coupled to a first node E1 of the first tracking bit line TRKBL. First terminal 130 is located along a first side of the memory macro 100. Second terminal 132 is coupled to a second node E2 of the first tracking bit line TRKBL. Second terminal 132 is located along a second side of the memory macro 100. The first side is an opposite side of the memory macro 100 from the second side. The first node E1 is on an opposite side of the memory macro 100 from the second node E2.

First set of memory cells 120 is configured as a first set of pull-down cells or a first set of loading cells responsive to a first set of control signals T1[1:M1] (collectively referred to as "first set of control signals T1"), where M1 is an integer corresponding to the number of rows in the first set of memory cells 120. A logical value of each signal of the first set of control signals T1 is independent from a logical value of other signals of the first set of control signals T1. In some embodiments, first set of control signals T1 is supplied by an external circuit (not shown). In some embodiments, first set of control signals T1 is supplied by an external supply voltage VDD (not shown) or external supply reference voltage VSS (not shown).

First set of memory cells 120 includes a first set of terminals 120a. Each memory cell of the first set of memory cells 120 has a corresponding terminal of the first set of terminals 120a. First set of terminals 120a is coupled to a first tracking control line C1. In some embodiments, first tracking control line C1 corresponds to a first tracking word line portion. First set of terminals 120a is configured to receive the first set of control signals T1 on the first tracking control line C1. First tracking control line C1 is configured to support parallel communication such that the first set of control signals T1 is a parallel stream of control data sent to the first set of memory cells 120. For example, in some embodiments, parallel communication includes each of the signals of the first set of control signals T1 being independent of each other during a common clock cycle. Each terminal of the first set of terminals 120a is configured to receive a corresponding signal of the first set of control signals T1. Each memory cell of the first set of memory cells 120 is configured to be independently controlled by a corresponding control signal of the first set of control signals T1. First set of terminals 120a is located along a side 150 of the memory macro 100.

Each memory cell of the first set of memory cells 120 is configured as a loading cell or a pull-down cell based upon a control signal of the first set of control signals T1 provided to a corresponding memory cell of the first set of memory cells 120. By individually adjusting each control signal of the first set of control signals T1, a number of cells of the first set of memory cells 120 configured as loading cells or pull-down cells is also adjusted. For example, in some embodiments, a number of cells of the first set of memory cells 120 are configured to receive corresponding control signals of the first set of control signals T1 that are logically low, and are configured as a first set of loading cells. In some embodiments, a number of cells of the first set of memory cells 120 are configured to receive corresponding control signals of the first set of control signals T1 that are logically high, and are configured as a first set of pull-down cells. In the first set of memory cells 120, a number of cells configured as pull-down cells or a number of cells configured as loading cells is adjustable responsive to the first set of control signals T1. In some embodiments, a configuration of the first set of memory cells 120 is adjusted from corresponding to the first set of loading cells to corresponding to the first set of pull-down cells based on a transition of the first set of control signals T1 from logically low to logically high. In some embodiments, writing data to or reading data from a memory cell in the first memory cell array 116 is affected by variances across the first memory array 102 due to process, voltage and temperature (PVT). The first set of pull-down cells and the first set of tracking cells are configured to track a memory cell in first memory cell array 116 to account for PVT variations across first memory array 102. For example, the first set of pull-down cells and the first set of tracking cells are configured to track a word line signal or a bit line/bit line bar signal of first memory cell array 116 during a read or write operation of a memory cell of the first memory cell array 116.

Second set of memory cells 122 is configured as the first set of pull-down cells or the first set of loading cells responsive to a second set of control signals T2[M1+1:M1+M2] (collectively referred to as "second set of control signals T2"). A logical value of each signal of the second set of control signals T2 is independent from a logical value of other signals of the second set of control signals T2. In some embodiments, second set of control signals T2 is supplied by an external circuit (not shown). In some embodiments, second set of control signals T2 is supplied by an external supply voltage VDD (not shown) or external supply reference voltage VSS (not shown).

Second set of memory cells 122 includes a second set of terminals 122a. Each memory cell of the second set of memory cells 122 has a corresponding terminal of the second set of terminals 122a. Second set of terminals 122a is coupled to a second tracking control line C2. In some embodiments, second tracking control line C2 corresponds to a second tracking word line portion. Second tracking control line C2 is configured to support parallel communication such that the second set of control signals T2 is a parallel stream of control data sent to the second set of memory cells 122. For example, in some embodiments, parallel communication includes each of the signals of the second set of control signals T2 being independent of each other during a common clock cycle. Second set of terminals 122a is configured to receive the second set of control signals T2 on the second tracking control line C2. Each terminal of the second set of terminals 122a is configured to receive a corresponding signal of the second set of control signals T2. Each memory cell of the second set of memory cells 122 is configured to be independently controlled by a corresponding control signal of the second set of control signals T2. Second set of terminals 122a is located along side 150 of the memory macro 100.

Each memory cell of the second set of memory cells 122 is configured as a loading cell or a pull-down cell based upon a control signal of the second set of control signals T2 provided to a corresponding memory cell of the second set of memory cells 122. By individually adjusting each control signal of the second set of control signals T2, a number of cells of the second set of memory cells 122 configured as loading cells or pull-down cells is also adjusted. For example, in some embodiments, a number of cells of the second set of memory cells 122 are configured to receive corresponding control signals of the second set of control signals T2 that are logically low, and are configured as a first set of loading cells. In some embodiments, a number of cells of the second set of memory cells 122 are configured to receive corresponding control signals of the second set of control signals T2 that are logically high, and are configured as a first set of pull-down cells. The first set of control signals T1 or the second set of control signals T2 is a parallel signal. In the second set of memory cells 122, a number of cells configured as pull-down cells or a number of cells configured as loading cells is adjustable responsive to the second set of control signals T2. In some embodiments, a configuration of the second set of memory cells 122 is adjusted from corresponding to the first set of pull-down cells to corresponding to the first set of loading cells based on a transition of the second set of control signals T2.

In the second set of memory cells 122, as the number of memory cells configured as pull-down cells in the second set of memory cells 122 is increased, the discharge rate of the first tracking bit line TRKBL is increased. In the second set of memory cells 122, as the number of memory cells configured as pull-down cells in the second set of memory cells 122 is decreased, the discharge rate of the first tracking bit line TRKBL is decreased.

The first set of pull-down cells is configured to adjust the voltage level of the first tracking bit line TRKBL responsive to the first set of control signals T1 or the second set of control cells T2. The first tracking bit line TRKBL is affected by a capacitance of the first set of loading cells. The first set of loading cells is configured or represented as a capacitive load on the first tracking bit line TRKBL. In some embodiments, the first set of pull-down cells and the first set of load cells are configured to generate a tracking time delay TTDLY between an edge of a tracking word line signal TRKWL and an edge of a sense amplifier enable (SAE) signal (not shown).

First memory cell array 116 includes an array of memory cells including M rows by N columns, where N is an integer corresponding to the number of columns and M is an integer corresponding to the number of rows and is expressed by formula 1.

$$M = M1 + M2 \quad (1)$$

where M1 is an integer corresponding to the number of rows in the first set of memory cells 120, where M2 is an integer corresponding to the number of rows in the second set of memory cells 122.

The number of rows M in the first memory cell array 116 is equal to or greater than 2. The number of columns N in the first memory cell array 116 is equal to or greater than 2. In some embodiments, first memory cell array 116 includes one or more single port (SP) SRAM cells. In some embodiments, first memory cell array 116 includes one or more dual port (DP) SRAM cells. Different types of memory cells in first memory cell array 116 are within the contemplated scope of the present disclosure. Memory cell 106 is a single memory cell in column 1 of the array of memory cells of first memory cell array 116.

First pre-charge circuit 104 is coupled to first tracking bit line TRKBL. First pre-charge circuit 104 is configured to receive a third set of control signals TRK_E. First pre-charge circuit 104 is configured to charge the first tracking bit line TRKBL to a pre-charge voltage level responsive to the third set of control signals TRK_E. The pre-charge voltage level corresponds to a logical high. In some embodiments, the pre-charge voltage level corresponds to a logical low.

First pre-charge circuit 104 comprises a first P-type metal oxide semiconductor (PMOS) transistor P1 and a second PMOS transistor P2.

First PMOS transistor P1 is configured to pre-charge the voltage of the first tracking bit line TRKBL to a logical high level responsive to third set of control signals TRK_E. The third set of control signals TRK_E is logically high or low. A gate terminal of first PMOS transistor P1 is coupled with the first tracking word line TRKWL and is configured to receive third set of control signals TRK_E. A source terminal of first PMOS transistor P1 is coupled with a supply voltage VDD. A drain terminal of first PMOS transistor P1 is coupled with a first node E1 of the first tracking bit line TRKBL.

Second PMOS transistor P2 is configured to pre-charge the voltage of the first tracking bit line TRKBL to a logical high level responsive to third set of control signals TRK_E. A gate terminal of second PMOS transistor P2 is coupled with the first tracking word line TRKWL and is configured to receive third set of control signals TRK_E. A source terminal of second PMOS transistor P2 is coupled with a supply voltage VDD. A drain terminal of second PMOS transistor P2 is coupled with a second node E2 of the first tracking bit line TRKBL. In some embodiments, the second node E2 of the first tracking bit line TRKBL is an opposite end of the first tracking bit line TRKBL from the first node E1 of the first tracking bit line TRKBL.

First tracking word line driver 106 is configured to control the first tracking word line TRKWL. First tracking word line driver 106 is configured to generate third set of control signals TRK_E. In some embodiments, a length of the first tracking word line TRKWL is designed to track a corresponding word line WL (not shown) in first memory cell array 116.

First tracking word line driver 106 comprises an inverter I1 and an inverter I2. In some embodiments, first tracking word line driver 106 is different than that shown in FIG. 1 and includes circuits other than inverter I1 or I2.

Inverter I1 has a first terminal configured to receive the third set of control signals TRK_E. Inverter I1 has a second terminal configured to output an inverted version of the third set of control signals TRK_E.

Inverter I2 has a first terminal configured to receive the inverted version of the third set of control signals TRK_E. Inverter I2 has a second terminal configured to output the third set of control signals TRK_E.

The first set of control signals T1 or the second set of control signals T2 is generated outside of the first memory array 102. First set of memory cells 120 and second set of memory cells 122 are located along the side 150 of the memory macro. First set of memory cells 120 and the second set of memory cells 122 are located in a same column of the memory macro 100.

Figure 2:
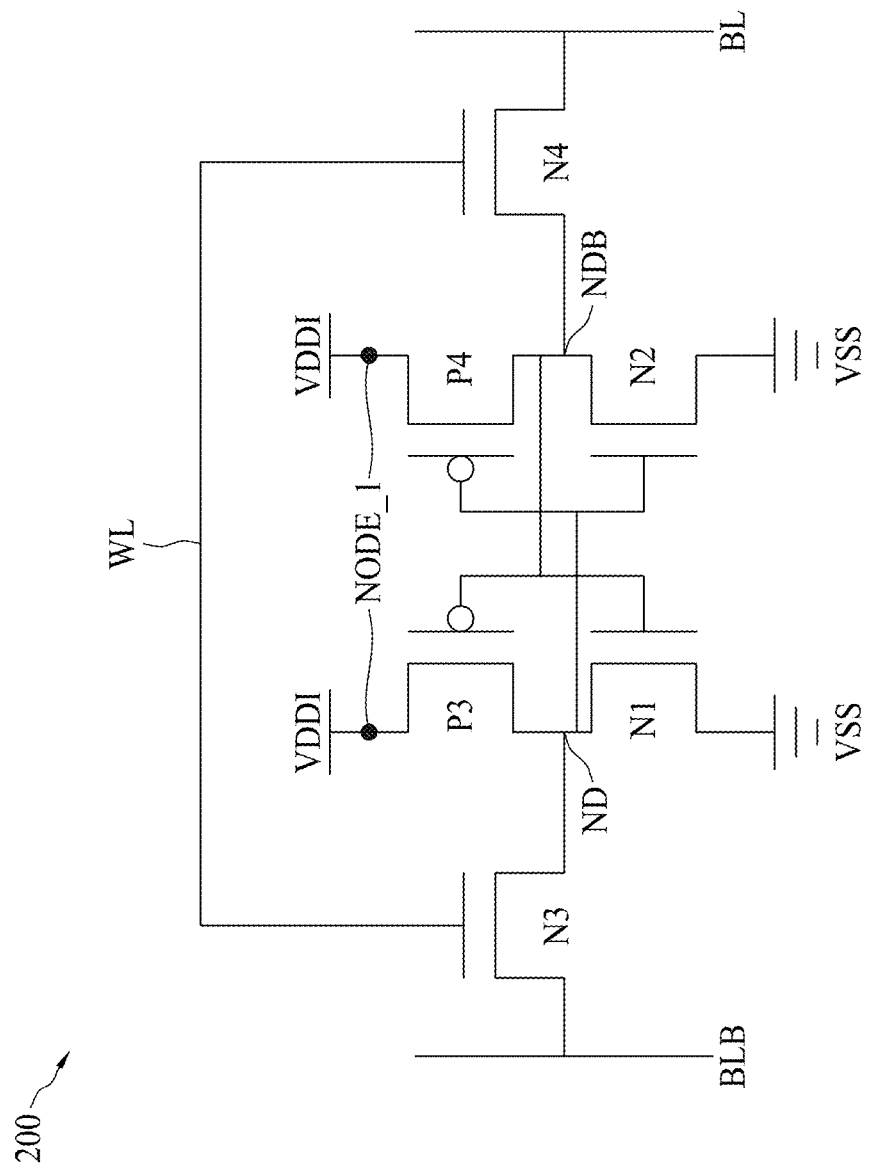
FIG. 2 is a circuit diagram of a memory cell usable in FIG. 1, in accordance with some embodiments.

FIG. 2 is a circuit diagram of a memory cell 200 usable in FIG. 1, in accordance with some embodiments.

Memory cell 200 is usable as one or more memory cells in the first memory cell array 116 of FIG. 1, FIGS. 4A-4B, FIG. 8 or FIG. 11. Memory cell 200 is an SRAM cell, and is used for illustration. Other types of memory are within the scope of various embodiments.

Memory cell 100 comprises two PMOS transistors P3 and P4, and four N-type metal oxide semiconductor (NMOS) transistors N1, N2, N3, and N4. Transistors P3, P4, N1, and N2 form a cross latch or a pair of cross-coupled inverters. For example, PMOS transistor P3 and NMOS transistor N1 form a first inverter while PMOS transistor P4 and NMOS transistor N2 form a second inverter.

A source terminal of each of PMOS transistors P3 and P4 are coupled together and are configured as a voltage supply node NODE_1 coupled to a first voltage source VDDI. A drain terminal of PMOS transistor P3 is coupled with a drain terminal of NMOS transistor N1, a gate terminal of PMOS transistor P4, a gate terminal of NMOS transistor N2, and a source terminal of NMOS transistor N3, and is configured as a storage node ND.

A drain terminal of PMOS transistor P4 is coupled with a drain terminal of NMOS transistor N2, a gate terminal of PMOS transistor P3, a gate terminal of NMOS transistor N1, and a source terminal of NMOS transistor N4, and is configured as a storage node NDB. A source terminal of each of NMOS transistors N1 and N2 are coupled together and is configured as a supply reference voltage node (not labelled) having a supply reference voltage VSS.

A word line WL is coupled with a gate terminal of each of NMOS transistors N3 and N4. Word line WL is also called a write control line because NMOS transistors N3 and N4 are configured to be controlled by a signal on word line WL in order to transfer data between bit lines BL, BLB and corresponding nodes ND, NDB.

A drain terminal of NMOS transistor N3 is coupled to a bit line BL. A drain terminal of NMOS transistor N4 is coupled to a bit line BLB. Bit lines BL and BLB are configured as both data input and output for memory cell 200. In some embodiments, in a write operation, applying a logical value to a first bit line BL and the opposite logical value to the other bit line BLB enables writing the logical values on the bit lines to memory cell 200. Each of bit lines BL and BLB is called a data line because the data carried on bit lines BL and BLB are written to and read from corresponding nodes ND and NDB.

Figure 3:
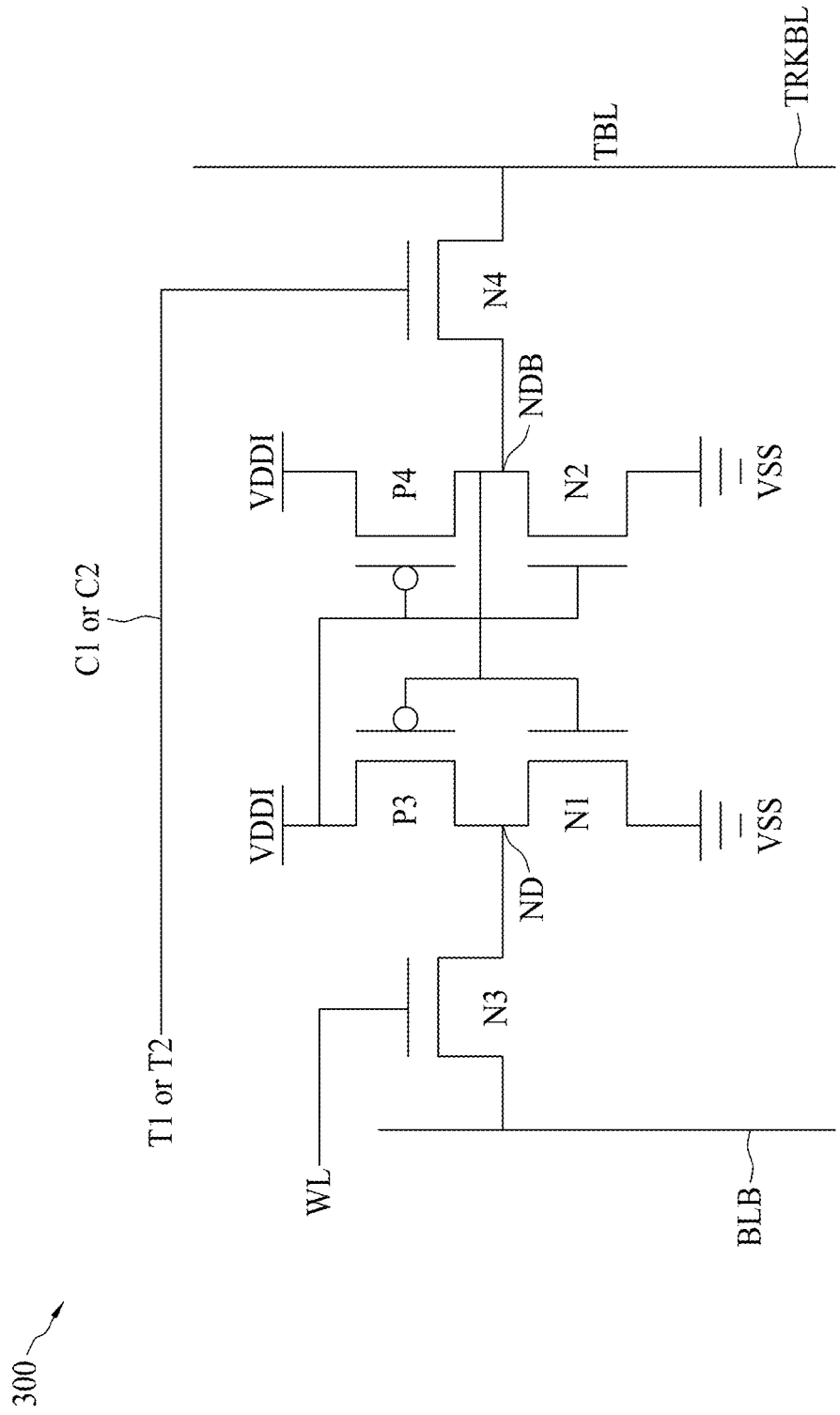
FIG. 3 is a circuit diagram of another memory cell usable in FIG. 1, in accordance with some embodiments.

FIG. 3 is a circuit diagram of another memory cell usable in FIG. 1, in accordance with some embodiments.

Memory cell 300 is usable as one or more memory cells in the first set of memory cells 120 or the second set of memory cells 122 of FIG. 1. Memory cell 300 is usable as one or more memory cells in the third set of memory cells 420 or the fourth set of memory cells 422 of FIG. 4B.

Memory cell 300 is an SRAM cell, and is used for illustration. Other types of memory are within the scope of various embodiments.

Memory cell 300 is an embodiment of memory cell 200 (FIG. 2). Components that are the same or similar to those in FIG. 2 are given the same reference numbers, and detailed description thereof is thus omitted.

In comparison with memory cell 200 of FIG. 2, the storage node ND of memory cell 300 is not coupled with the gate terminal of PMOS transistor P4 and the gate terminal of NMOS transistor N2. In comparison with memory cell 200 of FIG. 2, the drain terminal of PMOS transistor P3, the drain terminal of NMOS transistor N1 and the source terminal of NMOS transistor N3 of memory cell 300 are not coupled with the gate terminal of PMOS transistor P4 and the gate terminal of NMOS transistor N2.

In comparison with memory cell 200 of FIG. 2, the gate terminal of PMOS transistor P4 and the gate terminal of NMOS transistor N2 of memory cell 300 are coupled with the source terminal of each of PMOS transistors P3 and P4 and first voltage source VDDI. In comparison with memory cell 200 of FIG. 2, the gate terminal of NMOS transistor N4 of memory cell 300 is coupled with the first tracking control line C1 or the second tracking control line C2. In comparison with memory cell 200 of FIG. 2, the gate terminal of NMOS transistor N4 of memory cell 300 is configured to receive the first set of control signals T1 on the first tracking control line C1 or the second set of control signals T2 on the second tracking control line C2. First set of control signals T1, T1' (FIGS. 4A-4B), second set of control signals T2, T2' (FIGS. 4A-4B), fourth set of control signals T1a' (FIG. 4B) or fifth set of control signals T2a' (FIG. 4B) is supplied by an external circuit (not shown), an external supply voltage VDD (not shown) or an external supply reference voltage VSS (not shown). First set of control signals T1 or second set of control signals T2 is not supplied by either internal supply voltage VDDI or internal supply reference voltage VSS. First set of control signals T1' (FIGS. 4A-4B) or second set of control signals T2' (FIGS. 4A-4B) is not supplied by either internal supply voltage VDDI or internal supply reference voltage VSS. Fourth set of control signals T1a' (FIG. 4B) or fifth set of control signals T2a' (FIG. 4B) is not supplied by either internal supply voltage VDDI or internal supply reference voltage VSS. By configuring the gate terminal of NMOS transistor N4 to receive the first set of control signals T1 on the first tracking control line C1 or the second set of control signals T2 on the second tracking control line C2, memory cell 300 is dynamically adjusted from corresponding to a pull-down cell or a loading cell based on the first set of control signals T1 or the second set of control signals T2, and yields a more flexible memory macro circuit than other memory macro circuits. By configuring the gate terminal of NMOS transistor N4 for each memory cell in memory cell 300 to receive the first set of control signals T1 on the first tracking control line C1 or the second set of control signals T2 on the second tracking control line C2, the first tracking circuit 114 (or the second tracking circuit 414) is dynamically adjusted by the first set of control signals T1 or the second set of control signals T2, and yields a more flexible memory macro circuit than other memory macro circuits.

In comparison with memory cell 200 of FIG. 2, the drain terminal of NMOS transistor N4 of memory cell 300 is coupled to the first tracking bit line TRKBL. In comparison with memory cell 200 of FIG. 2, the bit line BLB of memory cell 300 is floating.

In some embodiments, a voltage of first voltage source VDDI is logically high causing NMOS transistor N2 to be turned on and PMOS transistor P4 to be turned off. In some embodiments, if first set of control signals T1 or second set of control signals T2 is logically high, then NMOS transistor N4 is turned on causing the first tracking bit line TRKBL to be electrically coupled to node NDB. In some embodiments, if NMOS transistor N2 is turned on and the first tracking bit line TRKBL is electrically coupled to node NDB, then the first tracking bit line TRKBL is caused to be discharged towards supply reference voltage VSS. In some embodiments, if the voltage of first voltage source VDDI is logically high and first set of control signals T1 or second set of control signals T2 is logically high, then NMOS transistor N2 is turned on and NMOS transistor N4 is turned on causing the first tracking bit line TRKBL to be discharged towards supply reference voltage VSS.

Figure 4A:
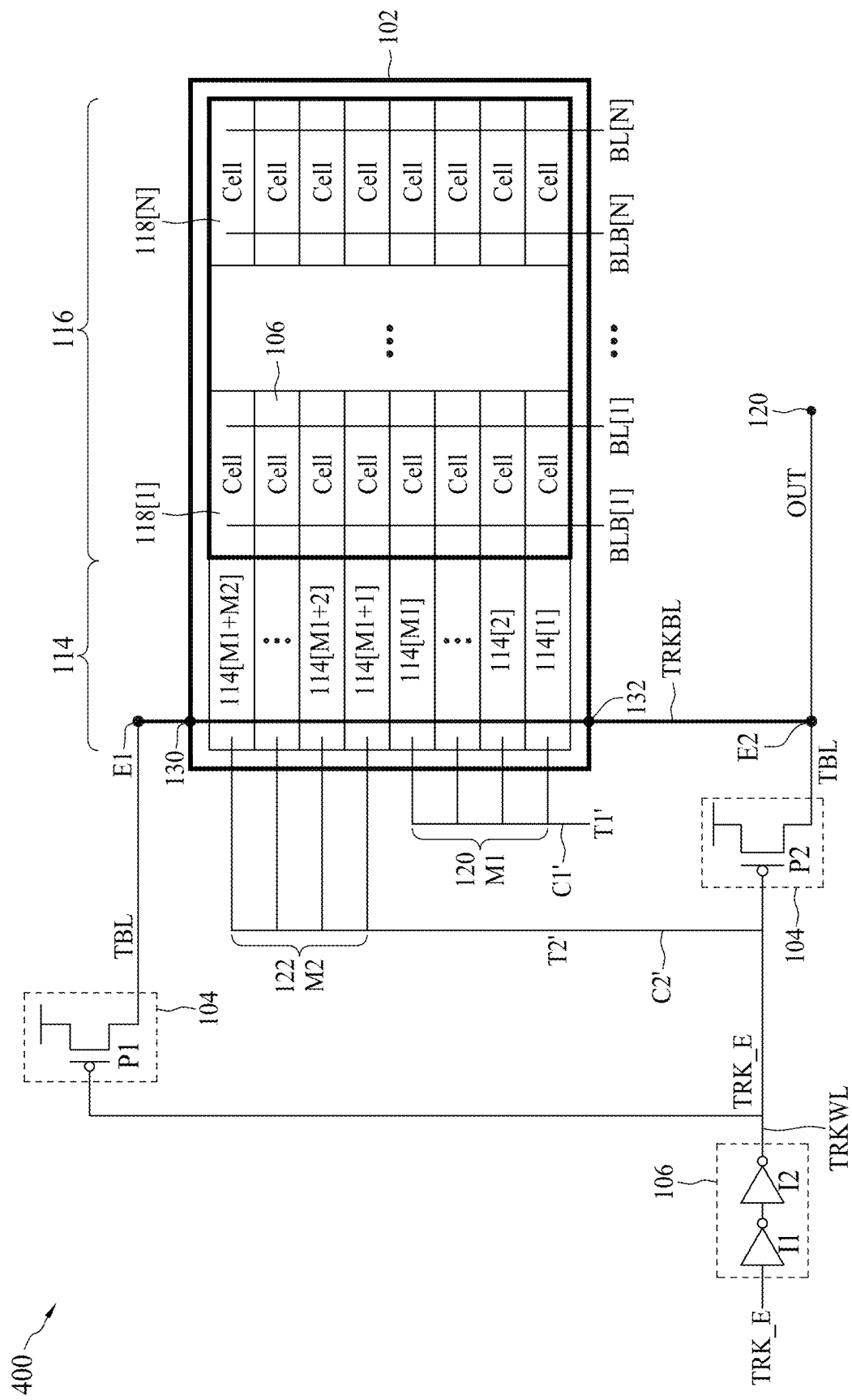
FIG. 4A is a circuit diagram of a memory macro, in accordance with some embodiments.

FIG. 4A is a circuit diagram of another memory macro 400, in accordance with some embodiments.

Memory macro 400 is usable as memory macro 100 of FIG. 1. Memory macro 400 is an embodiment of memory macro 100 (FIG. 1). The first set of control signals T1' is an embodiment of the first set of control signals T1 (FIG. 1). The first tracking control line C1' is an embodiment of the first tracking control line C1 (FIG. 1). The second set of control signals T2' is an embodiment of the second set of control signals T2 (FIG. 1). The second tracking control line C2' is an embodiment of the second tracking control line C2 (FIG. 1). Components that are the same or similar to those in FIG. 1 are given the same reference numbers, and detailed description thereof is thus omitted.

In comparison with memory macro 100 of FIG. 1, the first set of memory cells 120 of memory macro 400 is configured to receive the first set of control signals T1' on the first tracking control line C1'. In comparison with memory macro 100 of FIG. 1, each of the memory cells of the first set of memory cells 120 of memory macro 400 is configured to receive the same signal (e.g., first set of control signals T1'). In comparison with memory macro 100 of FIG. 1, first tracking control line C1' of memory macro 400 is configured to support serial communication such that the first set of control signals T1' is a single stream of data serially sent to each memory cell of the first set of memory cells 120. In some embodiments, serial communication includes each of the signals of the first set of control signals T1' being configured as a single stream of data that propagates over the first tracking control line C1' of memory macro 400 in sequence.

In comparison with memory macro 100 of FIG. 1, the second set of memory cells 122 of memory macro 400 is configured to receive the second set of control signals T2' on the second tracking control line C2'. In comparison with memory macro 100 of FIG. 1, the second tracking control line C2' of memory macro 400 is a portion of the first tracking word line TRKWL. In comparison with memory macro 100 of FIG. 1, the second set of control signals T2' of memory macro 400 corresponds to the third set of control signals TRK_E. In comparison with memory macro 100 of FIG. 1, each of the memory cells of the second set of memory cells 122 of memory macro 400 is configured to receive the same signal (e.g., second set of control signals T2'). In comparison with memory macro 100 of FIG. 1, second tracking control line C2' of memory macro 400 is configured to support serial communication such that the first set of control signals T1' is a single stream of data serially sent to each memory cell of the first set of memory cells 120.

Figure 4B:
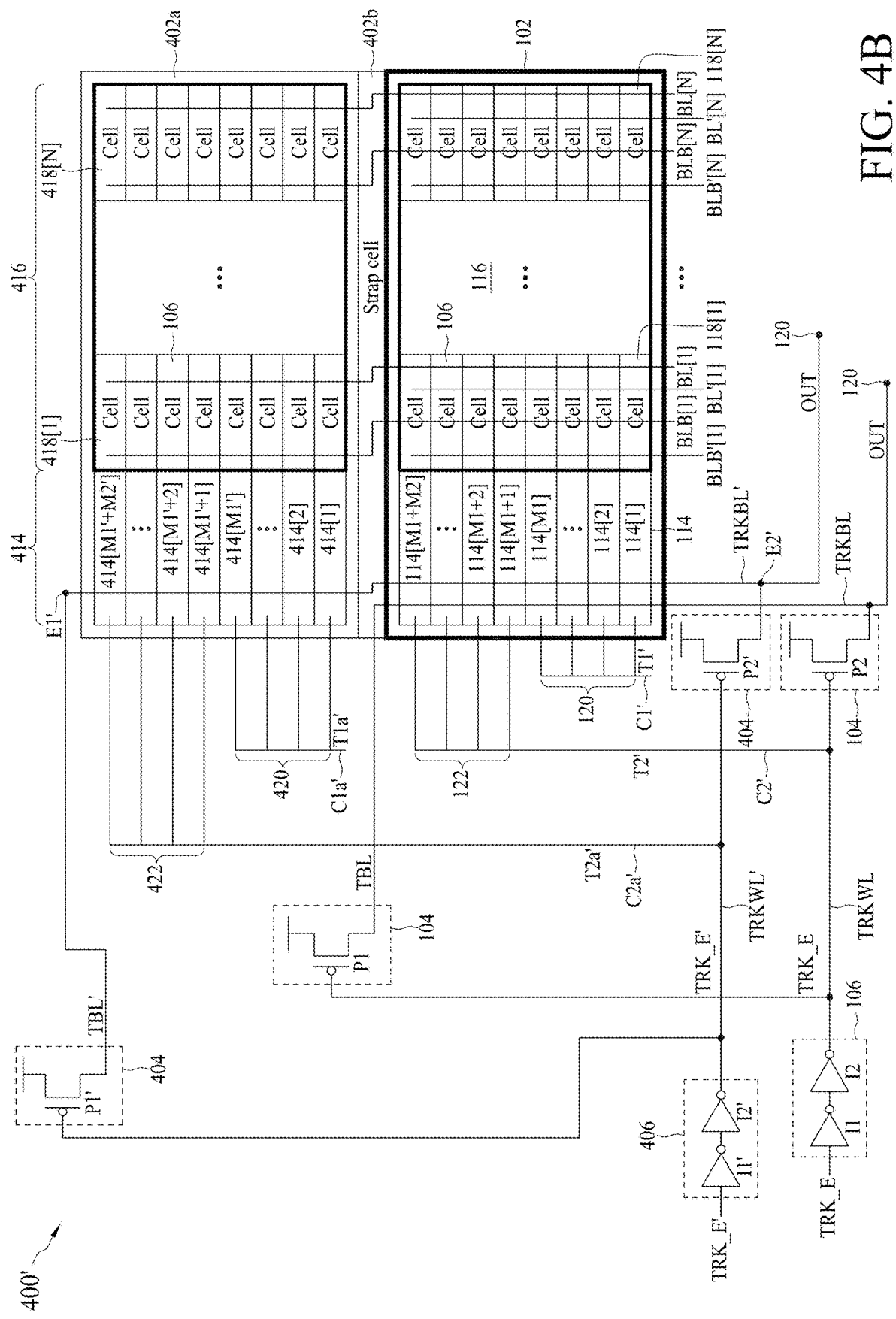
FIG. 4B is a circuit diagram of a memory macro, in accordance with some embodiments.

FIG. 4B is a circuit diagram of yet another memory macro 400', in accordance with some embodiments.

Memory macro 400' is an embodiment of memory macro 400 (FIG. 4A). In comparison with memory macro 400, memory macro 400' also includes a second memory array 402a, strap cells 402b, a second pre-charge circuit 404, a second tracking word line driver 406, a second tracking bit line TRKBL' and a second tracking word line TRKWL'. Components that are the same or similar to those in FIG. 1 or 4A are given the same reference numbers, and detailed description thereof is thus omitted.

Second memory array 402a is an embodiment of first memory array 102 (FIG. 1 or 4A-4B). Second memory array 402a is coupled to second pre-charge circuit 404. Second pre-charge circuit 404 is coupled to second tracking word line TRKWL' and second tracking word line driver 406. Second memory array 402a is separated from first memory array 102 by strap cells 402b. Strap cells 402b are arranged in a row between the memory array 402a and memory array 102. In some embodiments, strap cells 402b are arranged across multiple rows. In some embodiments, strap cells 402b correspond to dummy SRAM cells. Strap cells 402b are memory cells configured to provide voltage pick-up and to provide N-well or P-well bias that prevents voltage drop along a pair of bit lines BL, BLB that result in a difference in memory cell device voltages along the pair of bit lines BL, BLB as the bit lines BL, BLB extend along memory array 102 or 402a.

Second memory array 402a comprises a second tracking circuit 414 and a second memory cell array 416. In some embodiments, first memory array 102 corresponds to a first memory bank and second memory array 402a corresponds to a second memory bank.

Second tracking circuit 414 is an embodiment of first tracking circuit 114 (FIG. 1 or 4A-4B). Second memory cell array 416 is an embodiment of first memory cell array 116 (FIG. 1 or 4A-4B). In comparison with first tracking circuit 114 of FIG. 1 or 4A-4B, the second tracking circuit 414 comprises a second tracking bit line TRKBL', a third set of memory cells 414[1], . . . , 414[M1'] (collectively referred to as "third set of memory cells 420") and a fourth set of memory cells 414[M1'+1], . . . , 422[M1'+M2'] (collectively referred to as "fourth set of memory cells 422"), where M1' is an integer corresponding to the number of rows in the third set of memory cells 420, and M2' is an integer corresponding to the number of rows in the fourth set of memory cells 422. The second tracking bit line TRKBL' is coupled to the second pre-charge circuit 404. The second tracking bit line TRKBL' is also coupled to the third set of memory cells 420 and the fourth set of memory cells 422. The number of rows M1' in the third set of memory cells 420 is equal to or greater than 1. The number of rows M2' in the fourth set of memory cells 422 is equal to or greater than 1. In some embodiments, the number of rows M1' in the third set of memory cells 420 is equal to the number of rows M1 in the first set of memory cells 120. In some embodiments, the number of rows M2' in the fourth set of memory cells 422 is equal to the number of rows M2 in the second set of memory cells 122.

Third set of memory cells 420 is an embodiment of first set of memory cells 120 (FIG. 1 or 4A). In comparison with the first set of memory cells 120 of FIG. 1 or 4A-4B, the third set of memory cells 420 is configured to receive a fourth set of control signals T1a' on a third tracking control line C1a'. The fourth set of control signals T1a' is an embodiment of the first set of control signals T1' (FIG. 4A-4B). The third tracking control line C1a' is an embodiment of the first tracking control line C1' (FIG. 4A-4B).

Fourth set of memory cells 422 is an embodiment of second set of memory cells 122 (FIG. 1 or 4A-4B). In comparison with the second set of memory cells 122 of FIG. 1 or 4A-4B, the fourth set of memory cells 422 is configured to receive a fifth set of control signals T2a' on a fourth tracking control line C2a'. The fifth set of control signals T2a' is an embodiment of the second set of control signals T2' (FIG. 4A-4B). The fourth tracking control line C2a' is an embodiment of the second tracking control line C2' (FIG. 1).

Second pre-charge circuit 404 is an embodiment of first pre-charge circuit 104 (FIG. 1 or 4A-4B). In comparison with first pre-charge circuit 104 of FIG. 1 or 4A-4B, second pre-charge circuit 404 is coupled to second tracking bit line TRKBL', and is configured to receive a sixth set of control signals TRK_E'. Second tracking bit line TRKBL' is an embodiment of first tracking bit line TRKBL (FIG. 1 or 4A-4B). In comparison with the first tracking bit line TRKBL of FIG. 1 or 4A-4B, the second tracking bit line TRKBL' is configured to carry a second tracking bit line signal TBL'. Sixth set of control signals TRK_E' is an embodiment of sixth set of control signals TRK_E. Second pre-charge circuit 404 is configured to charge the second tracking bit line TRKBL' to a pre-charge voltage level responsive to the sixth set of control signals TRK_E'. The pre-charge voltage level corresponds to a logical high. In some embodiments, the pre-charge voltage level corresponds to a logical low.

Second pre-charge circuit 404 comprises a third PMOS transistor P1' and a fourth PMOS transistor P2'. Third PMOS transistor P1' is an embodiment of first PMOS transistor P1 (FIG. 1 or 4A-4B) and fourth PMOS transistor P2' is an embodiment of fourth PMOS transistor P2' (FIG. 1 or 4A-4B). Third PMOS transistor P1' is coupled to the second tracking bit line TRKBL' on a third node E1' of the second tracking bit line TRKBL'. Fourth PMOS transistor P2' is coupled to the second tracking bit line TRKBL' on a fourth node E2' of the second tracking bit line TRKBL'. In some embodiments, the fourth node E2' of the second tracking bit line TRKBL' is an opposite end of the second tracking bit line TRKBL' from the third node E1' of the second tracking bit line TRKBL'.

Second tracking word line driver 406 is an embodiment of first tracking word line driver 106 (FIG. 1 or 4A-4B). In comparison with first tracking word line driver 106 (FIG. 1 or 4A-4B), second tracking word line driver 406 is configured to control the second tracking word line TRKWL', and to generate the sixth set of control signals TRK_E'. Second tracking word line TRKWL' is an embodiment of first tracking word line TRKWL (FIG. 1 or 4A-4B). In some embodiments, a length of second tracking word line TRKWL' is designed to track a corresponding word line WL (not shown) in a second memory cell array 416. Second tracking word line driver 406 comprises an inverter I1' and an inverter I2'. In some embodiments, second tracking word line driver 406 is different than that shown in FIG. 4B and includes circuits other than inverter I1' or I2'. Inverter I1' is an embodiment of inverter I1 (FIG. 1 or 4A-4B) and inverter I2' is an embodiment of inverter I2 (FIG. 1 or 4A-4B).

First memory array 102 and second memory array 402a are configured to be operated out of sequence with each other. For example, one of the first memory array 102 or the second memory array 402a is configured to be accessed at a time. For example, memory macro 400' is configured such that tracking circuit 114 of first memory array 102 is operated during a first time period, and tracking circuit 414 of second memory array 402a is operated during a second time period, the first time period being different than the second time period. In some embodiments, memory macro 400' is configured such that first memory array 102 corresponds to a first memory bank and is accessed during a first time period, and second memory array 402a corresponds to a second memory bank and is accessed during a second time period, the first time period being different than the second time period.

In some embodiments, memory macro 400' is modified, similar to the embodiment shown in FIG. 1, to support parallel communication on one or more of the first tracking control line C1', the second tracking control line C2', the third tracking control line C1a' or the fourth tracking control line C2a'.

For example, in some embodiments, memory macro 400' is modified to support parallel communication on the first tracking control line C1' by changing the first tracking control line C1' to a tracking control line similar to the first tracking control line C1 of FIG. 1. In some embodiments, if first tracking control line C1' is configured to support parallel communication, then the first set of control signals T1' is a parallel stream of control data sent to the first set of memory cells 120. For example, in these embodiments, parallel communication includes each of the signals of the first set of control signals T1' being independent of each other during a common clock cycle. For example, in these embodiments, the logical value of each signal of the first set of control signals T1' is independent from a logical value of other signals of the first set of control signals T1'.

For example, in some embodiments, memory macro 400' is modified to support parallel communication on the second tracking control line C2' by disconnecting the second tracking control line C2' of FIG. 4B from the first tracking word line TRKWL. In some embodiments, if second tracking control line C2' is configured to support parallel communication, then the second set of control signals T2' is a parallel stream of control data sent to the second set of memory cells 122. For example, in these embodiments, parallel communication includes each of the signals of the second set of control signals T2' being independent of each other during a common clock cycle. For example, in these embodiments, the logical value of each signal of the second set of control signals T2' is independent from a logical value of other signals of the second set of control signals T2'.

For example, in some embodiments, memory macro 400' is modified to support parallel communication on the third tracking control line C1a' by changing the third tracking control line C1a' to a tracking control line similar to the second tracking control line C2 of FIG. 1. In some embodiments, if third tracking control line C1a' is configured to support parallel communication, then the fourth set of control signals T1a' is a parallel stream of control data sent to the third set of memory cells 420. For example, in these embodiments, parallel communication includes each of the signals of the fourth set of control signals T1a' being independent of each other during a common clock cycle. For example, in these embodiments, the logical value of each signal of the fourth set of control signals T1a' is independent from a logical value of other signals of the fourth set of control signals T1a'.

For example, in some embodiments, memory macro 400' is modified to support parallel communication on the fourth tracking control line C2a' by disconnecting the fourth tracking control line C2a' of FIG. 4B from the second tracking word line TRKWL'. In some embodiments, if fourth tracking control line C2a' is configured to support parallel communication, then the fifth set of control signals T2a' is a parallel stream of control data sent to the fourth set of memory cells 422. For example, in these embodiments, parallel communication includes each of the signals of the fifth set of control signals T2a' being independent of each other during a common clock cycle. For example, in these embodiments, the logical value of each signal of the fifth set of control signals T2a' is independent from a logical value of other signals of the fifth set of control signals T2a'.

Memory macro 100 (FIG. 1), memory macro 400 (FIG. 4A) or memory macro 400' (FIG. 4B) has less electro-migration in the tracking bit line (e.g., first tracking bit line TRKBL or second tracking bit line TRKBL') than other memory macro circuits. For example, in some embodiments, by coupling first pre-charge circuit 104 or second pre-charge circuit 404 on both ends of the tracking bit line (e.g., first tracking bit line TRKBL or second tracking bit line TRKBL'), memory macro 100 (FIG. 1), memory macro 400 (FIG. 4A) or memory macro 400' (FIG. 4B) has less electro-migration in the tracking bit line (e.g., first tracking bit line TRKBL or second tracking bit line TRKBL') than other memory macro circuits. A number of pull-down cells and a number of loading cells in memory macro 100 (FIG. 1), memory macro 400 (FIG. 4A) or memory macro 400' (FIG. 4B) are dynamically adjusted and yields a more flexible memory macro circuit than other memory macro circuits. The first tracking circuit 114 or the second tracking circuit 414 is dynamically adjusted by the set of control signals (e.g., first set of control signals T1, T1' (FIG. 1 or 4A-4B), second set of control signals T2, T2' (FIG. 1 or 4A-4B), fourth set of control signals T1a' (FIG. 4B), fifth set of control signals T2a' (FIG. 4B)) and yields a more flexible memory macro circuit than other memory macro circuits. The number of pull-down cells and loading cells in memory macro 100 (FIG. 1), memory macro 400 (FIG. 4A) or memory macro 400' (FIG. 4B) is dynamically adjusted by the set of control signals (e.g., first set of control signals T1, T1' (FIG. 1 or 4A-4B), second set of control signals T2, T2' (FIG. 1 or 4A-4B), fourth set of control signals T1a' (FIG. 4B), fifth set of control signals T2a' (FIG. 4B)) and yields a more flexible memory macro circuit than other memory macro circuits. In some embodiments, the number of pull-down cells and loading cells in memory macro 100 (FIG. 1), memory macro 400 (FIG. 4A) or memory macro 400' (FIG. 4B) are externally controlled by the set of control signals (e.g., first set of control signals T1, T1' (FIG. 1 or 4A-4B), second set of control signals T2, T2' (FIG. 1 or 4A-4B), fourth set of control signals T1a' (FIG. 4B), fifth set of control signals T2a' (FIG. 4B)) and yields a more flexible memory macro circuit than other memory macro circuits. In some embodiments, the pull-down cells and the loading cells in memory macro 100 (FIG. 1), memory macro 400 (FIG. 4A) or memory macro 400' (FIG. 4B) are not directly coupled to an internal supply voltage VDD or VSS of the memory macro 100 (FIG. 1), memory macro 400 (FIG. 4A) or memory macro 400' (FIG. 4B) like other memory macro circuits.

Figure 5A:
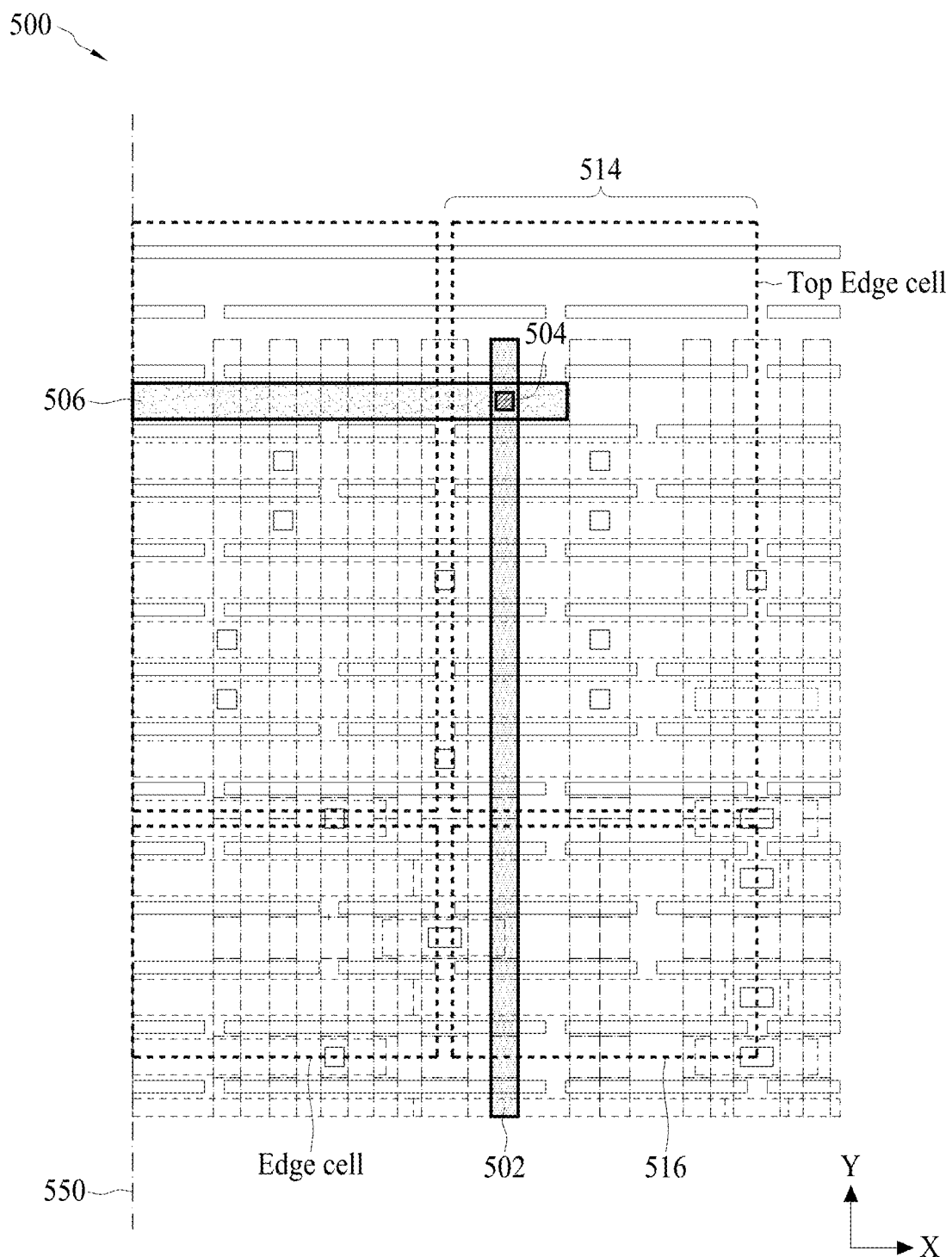
FIG. 5A is a portion of a layout diagram of a memory macro, in accordance with some embodiments.

FIG. 5A is a portion of a layout diagram of a memory macro 500 usable in FIGS. 1 & 4A-4B, in accordance with some embodiments.

Memory macro 500 includes a tracking bit line 502, a via 504, a tracking bit line pinout 506, a column of tracking cells 514, and a tracking cell 516. Memory macro 500 also includes other layout features (e.g., edge cells, memory cells or other metal layers) that are not described for simplicity.

Tracking bit line 502 is an embodiment of first tracking bit line TRKBL (FIG. 1 or 4A-4B) or second tracking bit line TRKBL' (FIG. 4B). Tracking bit line pinout 506 is an embodiment of first terminal 130 (FIG. 1). Column of tracking cells 514 is an embodiment of first tracking circuit 114 (FIGS. 1 & 4A-4B) or second tracking circuit 414 (FIG. 4B). Tracking cell 516 is an embodiment of memory cell 114[M1+M2] of the second set of memory cells 122 (FIGS. 1 & 4A-4B) or memory cell 414[M1'+M2'] of the second set of memory cells 422 (FIG. 4B). Components that are the same or similar to those in FIG. 1 or 4A-4B are given the same reference numbers, and detailed description thereof is thus omitted.

Tracking bit line 502 extends in a first direction Y and is arranged in the column of tracking cells 514. Tracking bit line 502 is located in a metal layer M0. Metal layer M0 is located below a metal layer M1. Metal layer M0 electrically connects a gate terminal and a drain terminal of the tracking cell 516 to other metal layers (e.g., metal layer M1, metal layer M2 (not shown), or metal layer M3 (not shown)) or other tracking cells (not shown). Tracking bit line 502 is electrically connected to tracking bit line pinout 506 by via 504. Tracking bit line 502 is a conductive material including copper, aluminum, nickel, titanium, tungsten or another suitable conductive material. In some embodiments, tracking bit line 502 includes one or more conductive line portions.

Via 504 extends into and out of the page and is configured to provide an electrical connection between conductive layers on different levels of memory macro 500. Via 504 is located in one or more layers that are over or under a corresponding contact (not shown) or landing pad (not shown). Via 504 is a conductive material including copper, aluminum, nickel, titanium, tungsten or another suitable conductive material. In some embodiments, via 504 includes one or more conductive line portions.

Tracking bit line pinout 506 is located on metal layer M1. Tracking bit line pinout 506 is located on a side portion 550 of the layout diagram of memory macro 500. Side portion 550 of memory macro 500 is an embodiment of side 150 (FIG. 1). Tracking bit line pinout 506 extends in a second direction X that is substantially perpendicular to the first direction Y. In some embodiments, a side surface of the tracking line pinout 506 is substantially flush with side portion 550. Tracking bit line pinout 506 is a conductive material including copper, aluminum, nickel, titanium, tungsten or another suitable conductive material. In some embodiments, tracking bit line pinout 506 includes one or more conductive line portions.

Figure 5B:
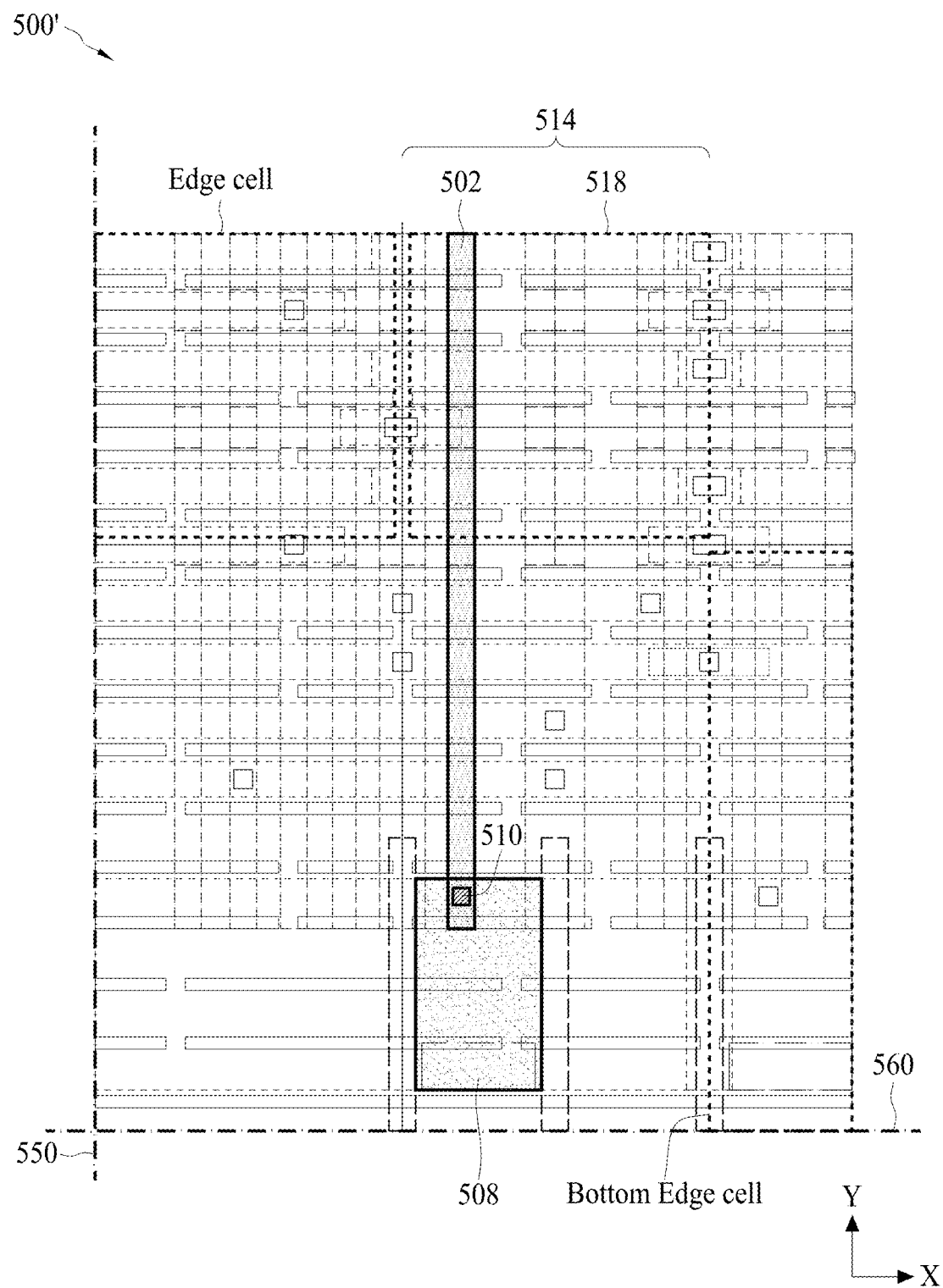
FIG. 5B is a portion of a layout diagram of a memory macro, in accordance with some embodiments.

FIG. 5B is a portion of a layout diagram of a memory macro 500' usable in FIGS. 1 & 4A-4B, in accordance with some embodiments.

Memory macro 500' is an embodiment of memory macro 500 (FIG. 5A). Memory macro 500' includes a tracking bit line 502, a tracking bit line pinout 508, a via 510, a column of tracking cells 514, and a tracking cell 518. Memory macro 500' also includes other layout features (e.g., edge cells, memory cells or other metal layers) that are not described for simplicity. Components that are the same or similar to those in FIG. 1, 4A-4B or 5A are given the same reference numbers, and detailed description thereof is thus omitted.

Tracking bit line pinout 508 is an embodiment of second terminal 132 (FIG. 1). Tracking cell 518 is an embodiment of memory cell 114[1] of the first set of memory cells 120 (FIGS. 1 & 4A-4B) or memory cell 414[1] of the third set of memory cells 420 (FIG. 4B).

Tracking bit line 502 is electrically connected to tracking bit line pinout 508 by via 510.

Metal layer M0 electrically connects a gate terminal and a drain terminal of the tracking cell 518 to other metal layers (e.g., metal layer M1, metal layer M2 (not shown), or metal layer M3 (not shown)) or other tracking cells.

Tracking bit line pinout 508 is located on metal layer M1. Tracking bit line pinout 508 is located on side portion 560 of the layout diagram of memory macro 500'. In some embodiments, side portion 560 of the layout diagram of memory macro 500' corresponds to a bottom portion of memory macro 500'.

Tracking bit line pinout 508 extends in a first direction Y. In some embodiments, a side surface of the tracking line pinout 508 is substantially flush with side portion 560. Tracking bit line pinout 508 is a conductive material including copper, aluminum, nickel, titanium, tungsten or another suitable conductive material. In some embodiments, tracking bit line pinout 508 includes one or more conductive line portions.

Via 510 extends into and out of the page and is configured to provide an electrical connection between conductive layers on different levels of memory macro 500'. Via 510 is located in one or more layers that are over or under a corresponding contact (not shown) or landing pad (not shown). Via 510 is a conductive material including copper, aluminum, nickel, titanium, tungsten or another suitable conductive material. In some embodiments, via 510 includes one or more conductive line portions.

Memory macro 500 (FIG. 5A) or memory macro 500' (FIG. 5B) has less electro-migration than other memory macro circuits. For example, in some embodiments, by coupling first pre-charge circuit 104 or second pre-charge circuit 404 to each of the tracking bit line pinout 506 and the tracking bit line pinout 508, the tracking bit line in memory macro 500 (FIG. 5A) or memory macro 500' (FIG. 5B) has less electro-migration than tracking bit lines in other memory macro circuits.

Figure 6:
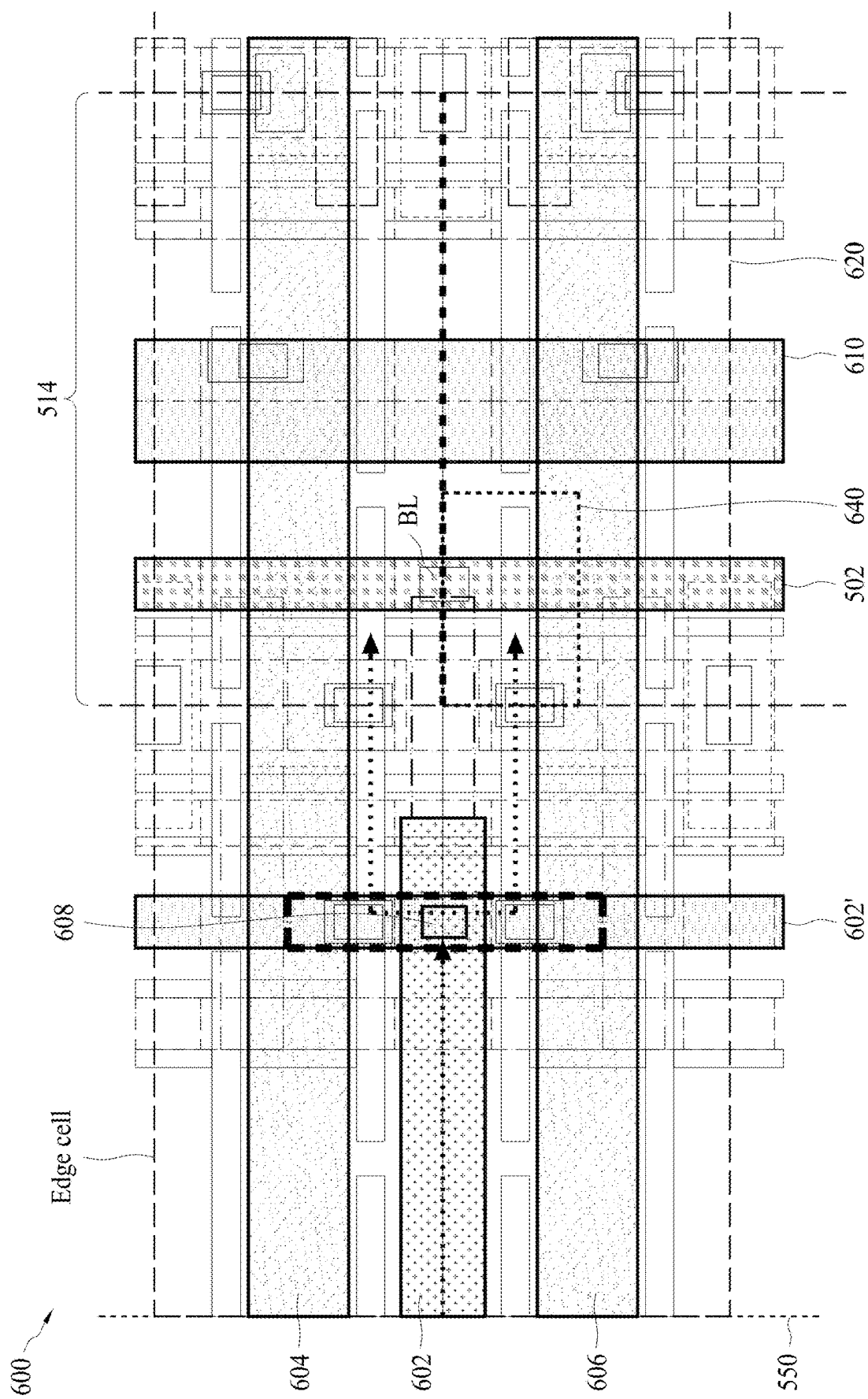
FIG. 6 is a layout diagram of a memory macro, in accordance with some embodiments.

FIG. 6 is a layout diagram of a memory macro 600 usable in FIGS. 1 & 4A-4B, in accordance with some embodiments.

Memory macro 600 includes a tracking bit line 502, a column of tracking cells 514, a voltage supply line 610, a tracking word line 602, a metal portion 602', a word line 604, a word line 606, a via 608 and a tracking cell 620. Memory macro 600 also includes other layout features (e.g., edge cells, details of memory cells or other metal layers) that are not described for simplicity.

Tracking bit line 502 is an embodiment of first tracking bit line TRKBL (FIG. 1 or 4A-4B) or second tracking bit line TRKBL' (FIG. 4B). Column of tracking cells 514 is an embodiment of first tracking circuit 114 (FIGS. 1 & 4A-4B) or second tracking circuit 414 (FIG. 4B). Tracking word line 602 is an embodiment of first tracking word line TRKWL (FIG. 1 or 4A-4B), first tracking control line C1 (FIG. 1 or 4A-4B), first tracking control line C1' (FIG. 4A), third tracking control line C1a' (FIG. 4B), second tracking control line C2 (FIG. 1 or 4A-4B) first tracking control line C2' (FIG. 4A), fourth tracking control line C2a' (FIG. 4B) or second tracking word line TRKWL' (FIG. 4B). Word line 604 is an embodiment of word line WL (FIG. 3). Word line 606 is an embodiment of word line WL (FIG. 3). Tracking cell 620 is an embodiment of a memory cell of the second set of memory cells 122 (FIGS. 1 & 4A-4B) or a memory cell of the second set of memory cells 422 (FIG. 4B). Components that are the same or similar to those in FIG. 1 or 4A-4B are given the same reference numbers, and detailed description thereof is thus omitted.

Tracking word line 602 extends in second direction X and is between word line 604 and word line 606. Tracking word line 602 is located in a metal layer M1. In some embodiments, a side portion (e.g., the portion adjacent to side portion 550) of the tracking word line 602 corresponds to a tracking word line pinout. In some embodiments, a side surface of the tracking word line 602 is substantially flush with side portion 550. Metal portion 602' extends in the first direction Y. Metal portion 602' is located in a metal layer M0. Metal layer M0 is located below metal layer M1. Metal portion 602' electrically connects a gate terminal and a drain terminal of one or more transistors in tracking cell 620 to other metal layers (e.g., metal layer M1, metal layer M2 (not shown), or metal layer M3 (not shown)), other tracking cells or tracking word line 602. Tracking word line 602 or metal portion 602' is a conductive material including copper, aluminum, nickel, titanium, tungsten or another suitable conductive material. In some embodiments, tracking word line 602 or metal portion 602' includes one or more conductive line portions.

Word line 604 and word line 606 extend in second direction X. Word line 604 and word line 606 are located in metal layer M1. Word line 604 or word line 606 is a conductive material including copper, aluminum, nickel, titanium, tungsten or another suitable conductive material. In some embodiments, word line 604 or word line 606 include one or more conductive line portions.

Via 608 electrically couples tracking word line 602 to metal portion 602'. Via 608 extends into and out of the page and is configured to provide an electrical connection between conductive layers on different levels of memory macro 600. Via 608 is located in one or more layers that are over or under a corresponding contact (not shown) or landing pad (not shown). Via 608 is a conductive material including copper, aluminum, nickel, titanium, tungsten or another suitable conductive material. In some embodiments, via 608 includes one or more conductive line portions.

Voltage supply line 610 extends in a first direction Y and is arranged in the column of tracking cells 514. Voltage supply line 610 is substantially parallel to tracking bit line 502. Voltage supply line 610 is located in metal layer M0. Voltage supply line 610 is electrically coupled to source terminals of PMOS transistors P3 and P4 within each memory cell 300 (FIG. 3) of the first set of memory cells 120 or the second set of memory cells 122. Voltage supply line 610 is a conductive material including copper, aluminum, nickel, titanium, tungsten or another suitable conductive material. In some embodiments, voltage supply line 610 includes one or more conductive line portions. Voltage supply line 610 is configured to provide a voltage of a first voltage source VDDI.

Tracking cell 620 is coupled to tracking word line 602 by metal portion 602' and via 608, and tracking cell 620 is dynamically adjusted by the set of control signals (e.g., first set of control signals T1, T1' (FIG. 1 or 4A-4B), second set of control signals T2, T2' (FIG. 1 or 4A-4B), fourth set of control signals T1a' (FIG. 4B), fifth set of control signals T2a' (FIG. 4B)), yielding a more flexible memory macro 600 than other memory macros. In some embodiments, tracking cell 620 is a pull-down cell or a loading cell that is externally controlled by the set of control signals (e.g., first set of control signals T1, T1' (FIG. 1 or 4A-4B), second set of control signals T2, T2' (FIG. 1 or 4A-4B), fourth set of control signals T1a' (FIG. 4B), fifth set of control signals T2a' (FIG. 4B)) yielding a more flexible memory macro 600 than other memory macros. For example, in some embodiments, tracking cell 620 is a pull-down cell that includes a pass gate transistor 640 having a gate that is not directly coupled to an internal reference supply voltage VSS of memory macro 600, and is dynamically adjusted by the set of control signals (e.g., first set of control signals T1, T1' (FIG. 1 or 4A-4B), second set of control signals T2, T2' (FIG. 1 or 4A-4B), fourth set of control signals T1a' (FIG. 4B), fifth set of control signals T2a' (FIG. 4B)). For example, in some embodiments, tracking cell 620 is a loading cell that includes pass gate transistor 640 having a gate that is not directly coupled to an internal supply voltage VDDI of memory macro 600, and is dynamically adjusted by the set of control signals (e.g., first set of control signals T1, T1' (FIG. 1 or 4A-4B), second set of control signals T2, T2' (FIG. 1 or 4A-4B), fourth set of control signals T1a' (FIG. 4B), fifth set of control signals T2a' (FIG. 4B)).

Figure 7:
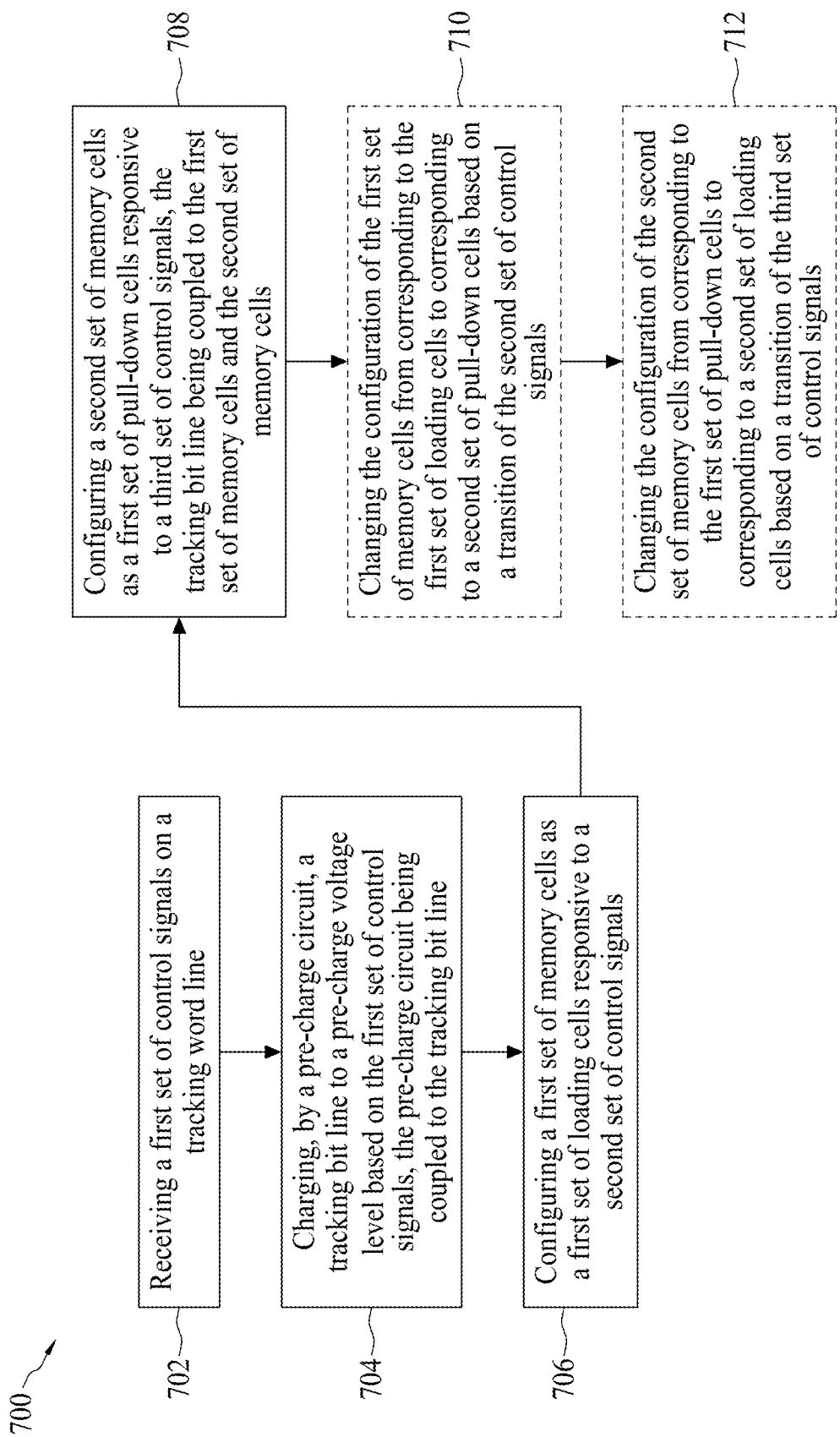
FIG. 7 is a flowchart of a method of operating a memory macro, such as the memory macro of FIG. 1, FIG. 4A or FIG. 4B, in accordance with some embodiments.

FIG. 7 is a flowchart of a method of operating a memory macro, such as the memory macro of FIG. 1, FIG. 4A or FIG. 4B, in accordance with some embodiments. It is understood that additional operations may be performed before, during, and/or after the method 700 depicted in FIG. 7, and that some other processes may only be briefly described herein.

In operation 702 of method 700, a first set of control signals (e.g., third set of control signals TRK_E or sixth set of control signals TRK_E' (FIGS. 1, 4A-4B)) is received on a tracking word line (e.g., tracking word line TRKWL (FIGS. 1, 4A-4B) or tracking word line TRKWL' (FIG. 4B)). In some embodiments, the first set of control signals (e.g., third set of control signals TRK_E or sixth set of control signals TRK_E') correspond to a tracking word line signal.

Method 700 continues with operation 704, where a tracking bit line ((e.g., first tracking bit line TRKBL or second tracking bit line TRKBL' (FIG. 1 or 4A-4B)) is charged, by a pre-charge circuit (e.g., first pre-charge circuit 104 (FIG. 1 or 4A-4B) or second pre-charge circuit 404 (FIG. 4B)), to a pre-charge voltage level (e.g., logical high or low) based on the first set of control signals (e.g., third set of control signals TRK_E or sixth set of control signals TRK_E' (FIGS. 1, 4A-4B)). The pre-charge circuit (e.g., first pre-charge circuit 104 (FIG. 1 or 4A-4B) or second pre-charge circuit 404 (FIG. 4B)) is coupled to the tracking bit line ((e.g., first tracking bit line TRKBL or second tracking bit line TRKBL' (FIG. 1 or 4A-4B)). In some embodiments, a first node (e.g., node E1 (FIG. 1 or 4A-4B) or node E1' (FIG. 4B)) and a second node (e.g., node E2 (FIG. 1 or 4A-4B) or node E2' (FIG. 4B)) of the tracking bit line ((e.g., first tracking bit line TRKBL or second tracking bit line TRKBL' (FIG. 1 or 4A-4B)) are charged by the pre-charge circuit (e.g., first pre-charge circuit 104 (FIG. 1 or 4A-4B) or second pre-charge circuit 404 (FIG. 4B)).

Method 700 continues with operation 706, where a first set of memory cells (e.g., first set of memory cells 120 (FIG. 1 or 4A-4B) or third set of memory cells 420 (FIG. 4B)) is configured as a first set of loading cells (e.g., memory cell 300 (FIG. 3)) responsive to a second set of control signals (e.g., first set of control signals T1, T1' (FIG. 1 or 4A-4B) or fourth set of control signals T1a' (FIG. 4B)).

Method 700 continues with operation 708, where a second set of memory cells (e.g., second set of memory cells 122 (FIG. 1 or 4A-4B) or fourth set of memory cells 422 (FIG. 4B)) is configured as a first set of pull-down cells (e.g., memory cell 300 (FIG. 3)) responsive to a third set of control signals (e.g., second set of control signals T2, T2' (FIG. 1 or 4A-4B) or fifth set of control signals T2a' (FIG. 4B)). The tracking bit line ((e.g., first tracking bit line TRKBL or second tracking bit line TRKBL' (FIG. 1 or 4A-4B)) is coupled to the first set of memory cells (e.g., first set of memory cells 120 (FIG. 1 or 4A-4B) or third set of memory cells 420 (FIG. 4B)) and the second set of memory cells (e.g., second set of memory cells 122 (FIG. 1 or 4A-4B) or fourth set of memory cells 422 (FIG. 4B)).

Method 700 continues with operation 710, where the configuration of the first set of memory cells (e.g., first set of memory cells 120 (FIG. 1 or 4A-4B) or third set of memory cells 420 (FIG. 4B)) is changed from corresponding to the first set of loading cells (e.g., memory cell 300 (FIG. 3)) to corresponding to a second set of pull-down cells (e.g., memory cell 300 (FIG. 3)) based on a transition of the second set of control signals (e.g., first set of control signals T1, T1' (FIG. 1 or 4A-4B) or fourth set of control signals T1a' (FIG. 4B)). In some embodiments, a configuration of the first set of memory cells (e.g., first set of memory cells 120 (FIG. 1 or 4A-4B) or third set of memory cells 420 (FIG. 4B)) is adjusted from corresponding to the first set of loading cells to the first set of pull-down cells based on a transition of the first set of control signals (e.g., first set of control signals T1, T1' (FIG. 1 or 4A-4B) or fourth set of control signals T1a' (FIG. 4B)) from logically low to logically high.

Method 700 continues with operation 712, where the configuration of the second set of memory cells (e.g., second set of memory cells 122 (FIG. 1 or 4A-4B) or fourth set of memory cells 422 (FIG. 4B)) is changed from corresponding to a first set of pull-down cells (e.g., memory cell 300 (FIG. 3)) to corresponding to a second set of loading cells (e.g., memory cell 300 (FIG. 3)) based on a transition of the third set of control signals (e.g., second set of control signals T2, T2' (FIG. 1 or 4A-4B) or fifth set of control signals T2a' (FIG. 4B)). In some embodiments, a configuration of the second set of memory cells (e.g., second set of memory cells 122 (FIG. 1 or 4A-4B) or fourth set of memory cells 422 (FIG. 4B)) is adjusted from corresponding to the first set of pull-down cells to the first set of loading cells based on a transition of the second set of control signals (e.g., second set of control signals T2, T2' (FIG. 1 or 4A-4B) or fifth set of control signals T2a' (FIG. 4B)) from logically high to logically low.

In some embodiments, configuring the second set of memory cells (e.g., second set of memory cells 122 (FIG. 1 or 4A-4B) or fourth set of memory cells 422 (FIG. 4B)) as the set of pull-down cells responsive to the third set of control signals (e.g., second set of control signals T2, T2' (FIG. 1 or 4A-4B) or fifth set of control signals T2a' (FIG. 4B)) includes pulling, by the second set of memory cells (e.g., second set of memory cells 122 (FIG. 1 or 4A-4B) or fourth set of memory cells 422 (FIG. 4B)), the voltage level of the tracking bit line ((e.g., first tracking bit line TRKBL or second tracking bit line TRKBL' (FIG. 1 or 4A-4B)) from the pre-charged voltage level (e.g., logical high) towards a logical low level, the second set of memory cells (e.g., second set of memory cells 122 (FIG. 1 or 4A-4B) or fourth set of memory cells 422 (FIG. 4B)) being responsive to the third set of control signals (e.g., second set of control signals T2, T2' (FIG. 1 or 4A-4B) or fifth set of control signals T2a' (FIG. 4B)).

Figure 8:
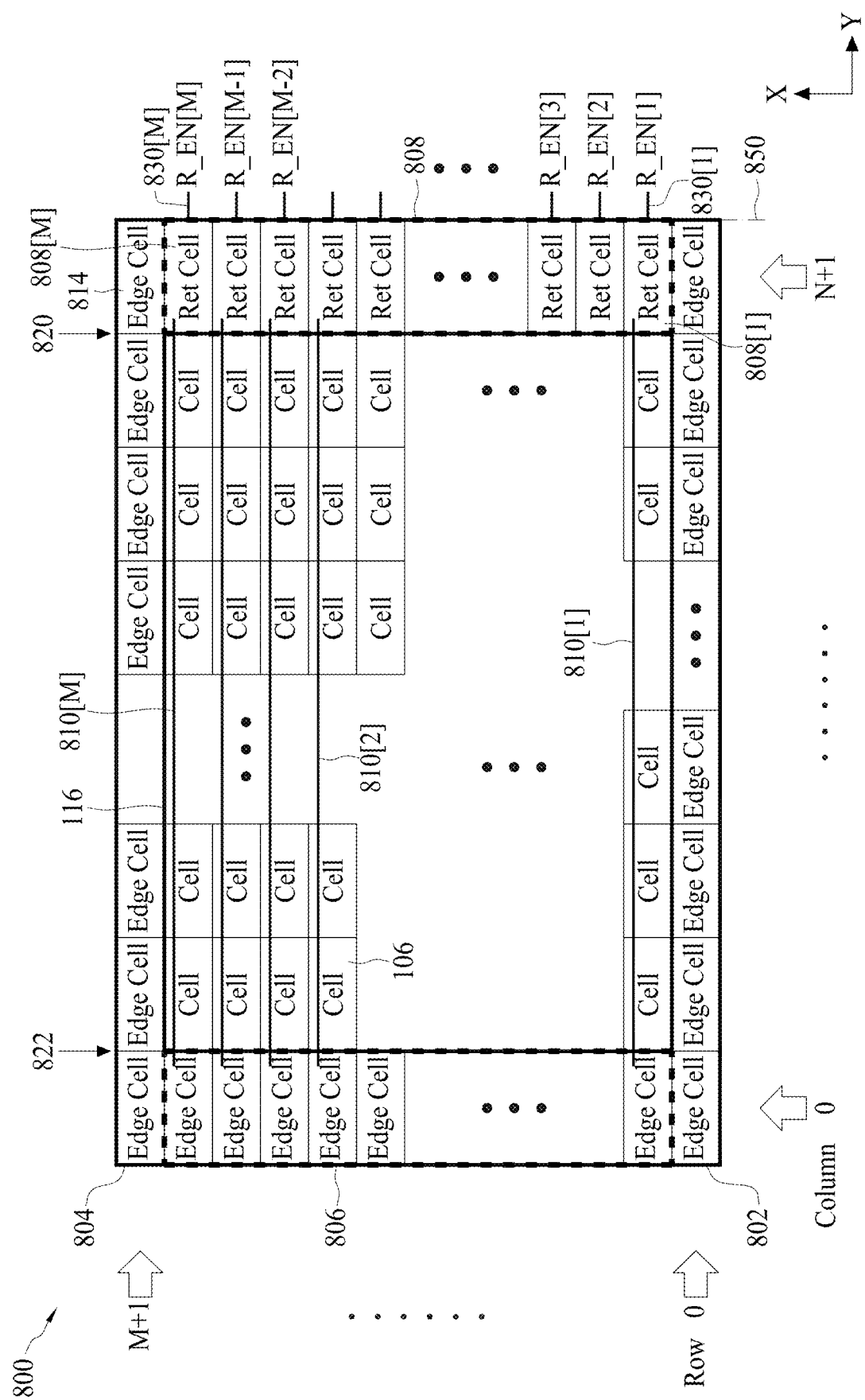
FIG. 8 is a circuit diagram of a memory macro, in accordance with some embodiments.

FIG. 8 is a circuit diagram of a memory macro 800, in accordance with some embodiments.

Memory macro 800 is an embodiment of memory macro 100 (FIG. 1). In comparison with memory macro 100 of FIG. 1, memory macro 800 further includes a first set of edge cells 802, a second set of edge cells 804, a third set of edge cells 806, a set of retention circuits 808[1], . . . , 808[M]

(collectively referred to as "set of retention circuits 808") and a set of conductive lines 810[1], ..., 810[M] (collectively referred to as "set of conductive lines 810"), where M is an integer corresponding to the number of rows in first memory cell array 116. Components that are the same or similar to those in FIG. 1 or 4A-4B are given the same reference numbers, and detailed description thereof is thus omitted.

Memory macro 800 includes an array having M+2 rows and N+2 columns, where N is an integer corresponding to the number of columns in first memory cell array 116 and M is an integer corresponding to the number of rows in first memory cell array 116. A center portion of memory macro 800 corresponds to first memory cell array 116 of FIG. 1. First set of edge cells 802, second set of edge cells 804, third set of edge cells 806 and set of retention circuits 808 are configured to enclose the first memory cell array 116 in FIG. 8.

First set of edge cells 802 includes N+2 edge cells, where N is an integer corresponding to the number of columns in first memory cell array 116. First set of edge cells 802 is arranged in row 0 of memory macro 800. Row 0 is arranged in the second direction X. First set of edge cells 802 includes N+2 edge cells. Edge cells are memory cells located along an edge of memory macro 800. In some embodiments, edge cells correspond to dummy cells. In some embodiments, edge cells have a same structure as a structure of memory cells in first memory cell array 116. In some embodiments, edge cells correspond to an SRAM portion of memory macro 800. In some embodiments, edge cells include one or more single port (SP) SRAM cells. In some embodiments, edge cells include one or more dual port (DP) SRAM cells. Different types of memory cells in first set of edge cells 802 are within the contemplated scope of the present disclosure.

Second set of edge cells 804 includes N+2 edge cells, where N is an integer corresponding to the number of columns in first memory cell array 116. Second set of edge cells 804 is arranged in row M+1 of memory macro 800, where M is an integer corresponding to the number of rows in first memory cell array 116. Row M+1 is arranged in the second direction X. Second set of edge cells 804 includes N+2 edge cells.

Third set of edge cells 806 includes M edge cells, where M is an integer corresponding to the number of rows in first memory cell array 116. Third set of edge cells 806 is arranged in column 0 of memory macro 800. Column 0 is arranged in the first direction Y. Third set of edge cells 806 includes M edge cells.

Set of retention circuits 808 includes M retention circuits 808[1], ..., 808[M], where M is an integer corresponding to the number of rows in first memory cell array 116. Set of retention circuits 808 is arranged in column N+1 of memory macro 800, where N is an integer corresponding to the number of columns in first memory cell array 116. Column N+1 is arranged in the first direction Y. A number of retention circuits of the set of retention circuits 808 corresponds to a number of rows in the first memory cell array 116. In some embodiments, set of retention circuits 808 is configured to replace another set of edge cells (e.g. shown as fourth set of edge cells 1108) in memory macro 800.

Set of retention circuits 808 are located along an edge 850 of memory macro 800. In some embodiments, set of retention circuits 808 correspond to SRAM cells in an SRAM portion of memory macro 800. In some embodiments, each retention circuit of the set of retention circuits 808 has a same structure as a structure of memory cells in the first memory cell array 116, but each retention circuit of the set of retention circuits 808 is configured as a retention circuit (e.g., retention circuit 900 in FIG. 9). In some embodiments, each retention circuit of the set of retention circuits 808 include one or more single port (SP) SRAM cells configured as a retention circuit (e.g., retention circuit 900 in FIG. 9). In some embodiments, each retention circuit of the set of retention circuits 808 include one or more dual port (DP) SRAM cells configured as a retention circuit (e.g., retention circuit 900 in FIG. 9). Different types of memory cells in set of retention circuits 808 are within the contemplated scope of the present disclosure. In some embodiments, each retention circuit of the set of retention circuits 808 does not include logic devices. In some embodiments, logic devices correspond to devices that do not have the same structure as a structure of SRAM cells in the first memory cell array 116.

Set of retention circuits 808 are configured to receive a set of control signals R_EN. Set of retention circuits 808 are configured to be turned on or off responsive to the set of control signals R_EN.

Each retention circuit of the set of retention circuits 808 is configured to receive a corresponding control signal of the set of control signals R_EN[1], ..., 808[M] (collectively referred to as "set of control signals R_EN") on a corresponding terminal of the set of terminals 830[1], ..., 830[M] (collectively referred to as "set of terminals 830"), where M is an integer corresponding to the number of rows in first memory cell array 116. Each retention circuit of the set of retention circuits 808 is coupled to a corresponding row of memory cells of first memory cell array 116 by a corresponding conductive line of the set of conductive lines 810. Each retention circuit of the set of retention circuits 808 is configured to be independently controlled by a corresponding control signal of the set of control signals R_EN. A number of retention circuits of the set of retention circuits 808 is adjustable responsive to the set of control signals R_EN. Each control signal of the set of control signals R_EN is logically high or low. For example, in some embodiments, the control signal R_EN is logically low such that the set of retention circuits 808 is turned on causing the set of retention circuits 808 to supply a second voltage value of a second voltage source CVDD (shown in FIG. 9) to the first memory cell array 116 during a sleep operational mode. In some embodiments, during the sleep operational mode, the voltage value of the second voltage source CVDD corresponds to a minimum voltage sufficient to correctly maintain the data stored in the first memory cell array 116. In some embodiments, a voltage value of the second voltage source CVDD is less than a voltage value of the first voltage source VDDI. In some embodiments, the control signal R_EN is logically low during the sleep operational mode. For example, in some embodiments, the control signal R_EN is logically high such that the set of retention circuits 808 is turned off and the set of retention circuits 808 do not supply the second voltage value of the second voltage source CVDD (shown in FIG. 9) to the first memory cell array 116. In some embodiments, the control signal R_EN is logically high during an active mode. In some embodiments, the first voltage source VDDI (shown in FIG. 2) is configured to supply a voltage to the first memory cell array 116 during the active mode. The set of control signals R_EN is generated outside of memory macro 800 by an external circuit (not shown). In some embodiments, each terminal of the set of terminals 830 is located along an edge of memory macro 800. In some embodiments, set of control signals R_EN is supplied by an external supply voltage VDD (not shown) or external supply reference voltage VSS (not shown).

Set of conductive lines 810 extends in the second direction X. Each conductive line of the set of conductive lines 810 is arranged in a corresponding row of memory cells of first memory cell array 116. Set of conductive lines 810 is coupled to voltage supply node NODE_1 (shown in FIG. 2) of memory cell 200. Each conductive line of the set of conductive lines 810 is coupled to a corresponding row of memory cells of first memory cell array 116 by a corresponding voltage supply node NODE_1 of each memory cell in the corresponding row of memory cells of first memory cell array 116. In some embodiments, set of conductive lines 810 are configured to provide the voltage value of the second voltage source CVDD (shown in FIG. 9) to the first memory cell array 116. Set of conductive lines 810 is a conductive material including copper, aluminum, nickel, titanium, tungsten or another suitable conductive material. In some embodiments, Set of conductive lines 810 includes one or more conductive line portions.

FIG. 9 is a circuit diagram of a retention circuit 900 usable in FIG. 8, in accordance with some embodiments. Retention circuit 900 is usable as one or more retention circuits in the set of retention circuits 808 of FIG. 8 or the set of retention circuits 1102 of FIG. 11.

Figure 11:
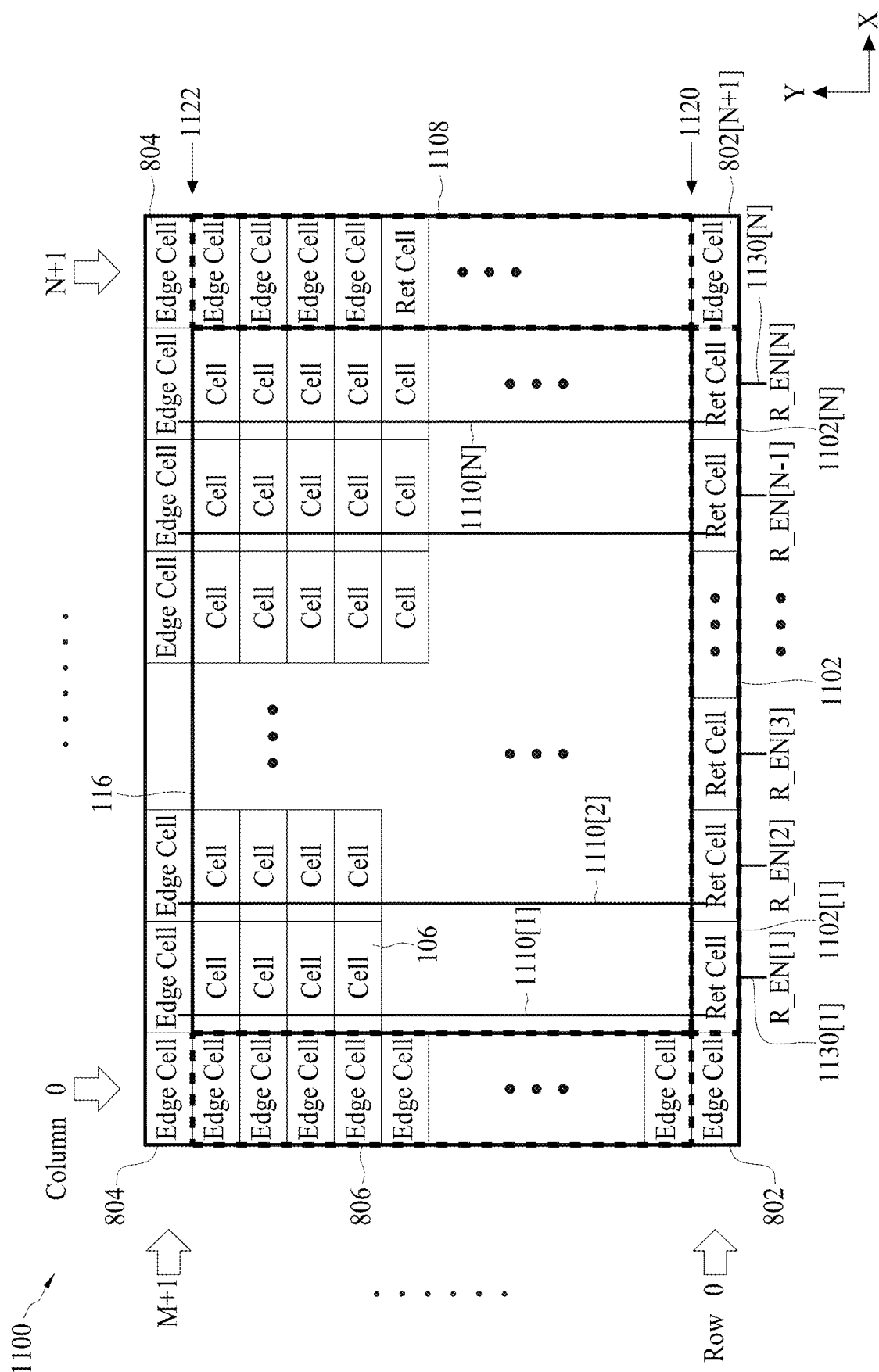
FIG. 11 is a circuit diagram of a memory macro, in accordance with some embodiments.

Retention circuit 900 is an embodiment of retention circuit 808[1], ..., 808[M] of the set of retention circuits of FIG. 8 or a retention circuit 1102[1], ..., 1102[N] of the set of retention circuits 1102 of FIG. 11. Components that are the same or similar to those in FIG. 8 or 11 are given the same reference numbers, and detailed description thereof is thus omitted.

Retention circuit 900 comprises a PMOS transistor P3 coupled to a diode 902.

A source terminal of PMOS transistor P3 is coupled to the second voltage source CVDD. A gate terminal of PMOS transistor P3 is configured to receive a control signal EN1 of the set of control signals R_EN. Control signal EN1 is an embodiment of a control signal R_EN[1], ..., R_EN[M] of the set of control signals R_EN of FIG. 8 or a control signal R_EN[1], ..., R_EN[N] of the set of control signals R_EN of FIG. 11. PMOS transistor P3 is turned on or off based on control signal EN1. A drain terminal of PMOS transistor P3 is coupled to an anode terminal 904 of diode 902 by node NODE_2.

Diode 902 has an anode terminal 904 and a cathode terminal 906. Second terminal 906 of diode 902 is coupled to a conductive line of the set of conductive lines 810 (FIG. 8) or 1110 (FIG. 11). Cathode terminal 906 corresponds to node NODE_3. In some embodiments, if control signal EN1 is a logical low, PMOS transistor P3 turns on causing a voltage VN1 of node NODE_3 to be equal to a difference between a voltage level of the second voltage source CVDD and a threshold voltage of diode 902. In some embodiments, if control signal EN1 is a logical high, PMOS transistor P3 turns off causing the second voltage source VDD to be disconnected from node NODE_3.

Figures 10A, 10B:
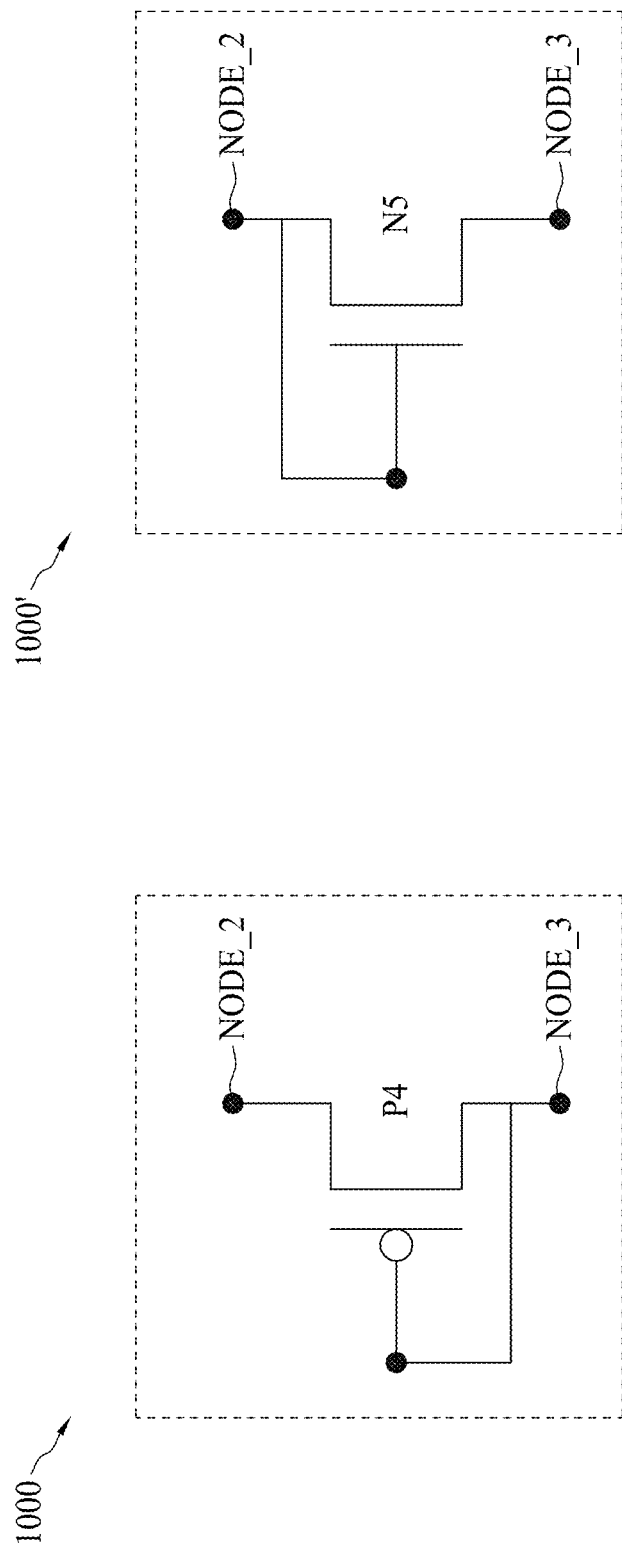
FIG. 10A is a circuit diagram of a diode, in accordance with some embodiments.
FIG. 10B is a circuit diagram of a diode, in accordance with some embodiments.

FIG. 10A is a circuit diagram of a diode 1000 usable in FIG. 9, in accordance with some embodiments.

Diode 1000 is an embodiment of the diode 902 of FIG. 9. Components that are the same or similar to those in FIG. 8-9 or 11 are given the same reference numbers, and detailed description thereof is thus omitted.

Diode 1000 comprises a diode connected PMOS transistor P4. A gate terminal of PMOS transistor P4 is coupled to a drain terminal of PMOS transistor P4 and node NODE_3. A source terminal of PMOS transistor P4 is coupled to node NODE_2. The source terminal of PMOS transistor P4 is coupled to a conductive line of the set of conductive lines 810 (FIG. 8) or 1110 (FIG. 11).

FIG. 10B is a circuit diagram of a diode 1000' usable in FIG. 9, in accordance with some embodiments.

Diode 1000' is an embodiment of diode 902 of FIG. 9. Diode 1000' is an embodiment of diode 1000 of FIG. 10A. Components that are the same or similar to those in FIG. 8-9 or 11 are given the same reference numbers, and detailed description thereof is thus omitted.

Diode 1000' comprises a diode connected NMOS transistor N5. A gate terminal of NMOS transistor N5 is coupled to a drain terminal of NMOS transistor N5 and node NODE_2. A source terminal of NMOS transistor N5 is coupled to node NODE_3. The source terminal of NMOS transistor N5 is coupled to a conductive line of the set of conductive lines 810 (FIG. 8) or 1110 (FIG. 11).

FIG. 11 is a circuit diagram of a memory macro 1100, in accordance with some embodiments. Memory macro 1100 is an embodiment of memory macro 100 (FIG. 1). Memory macro 1100 is an embodiment of memory macro 800 (FIG. 8). Components that are the same or similar to those in FIG. 1, 2 4A-4B or 8 are given the same reference numbers, and detailed description thereof is thus omitted.

In comparison with memory macro 800 of FIG. 8, memory macro 1100 includes a set of retention circuits 1102[1], ..., 1102[N] (collectively referred to as "set of retention circuits 1102") instead of set of retention circuits 808 of FIG. 8, where N is an integer corresponding to the number of columns in first memory cell array 116. Set of retention circuits 1102 is an embodiment of set of retention circuits 808 of FIG. 8. In comparison with memory macro 800 of FIG. 8, set of retention circuits 1102 replaces edge cells 802[1], ..., 802[N] of the first set of edge cells 802 of FIG. 8.

Set of retention circuits 1102 includes N retention circuits 1102[1], ..., 1102[N], where N is an integer corresponding to the number of columns in first memory cell array 116 of FIG. 11. Set of retention circuits 1102 is arranged in row 0 of memory macro 1100. Set of retention circuits 1102 extend in the second direction X. A number of retention circuits of the set of retention circuits 1102 corresponds to a number of columns in the first memory cell array 116 of FIG. 11. In some embodiments, set of retention circuits 1102 is configured to replace another set of edge cells (e.g. shown as edge cells 802[1], ..., 802[N] in memory macro 800).

Set of retention circuits 1102 are located along an edge of memory macro 1100. Each retention circuit of the set of retention circuits 1102 is configured to receive a corresponding control signal of the set of control signals set of control signals R_EN" on a corresponding terminal of the set of terminals 1130[1], ..., 1130[N] (collectively referred to as "set of terminals 1130"), where N is an integer corresponding to the number of columns in first memory cell array 116 of FIG. 11. Set of terminals 1130 is an embodiment of set of terminals 830 of FIG. 8. Each retention circuit of the set of retention circuits 1102 is coupled to a corresponding column of memory cells of first memory cell array 116 by a corresponding conductive line of the set of conductive lines 1110[1], ..., 1110[N] (collectively referred to as "set of conductive lines 1110"). In some embodiments, each terminal of the set of terminals 1130 is located along an edge of memory macro 1100.

In comparison with memory macro 800 of FIG. 8, memory macro 1100 includes fourth set of edge cells 1108, which replace set of retention circuits 808 of FIG. 8. Fourth set of edge cells 1108 is an embodiment of third set of edge cells 806 of FIG. 8. Fourth set of edge cells 1108 includes M edge cells, where M is an integer corresponding to the number of rows in first memory cell array 116. Fourth set of edge cells 1108 is arranged in column N+1 of memory macro 1100. Column 0 is arranged in the first direction Y. Fourth set of edge cells 1108 includes M edge cells. First set of edge cells 802, second set of edge cells 804, fourth set of edge cells 1108 and set of retention circuits 1102 are configured to enclose the first memory cell array 116 in FIG. 11.

In comparison with memory macro 800 of FIG. 8, memory macro 1100 includes a set of conductive lines 1110 instead of set of conductive lines 810 of FIG. 8. Set of conductive lines 1110 is an embodiment of set of conductive lines 810 of FIG. 8. In comparison with memory macro 800 of FIG. 8, set of conductive lines 1110 extend in the first direction Y. Each conductive line of the set of conductive lines 1110 is arranged in a corresponding column of memory cells of first memory cell array 116. Set of conductive lines 1110 is coupled to voltage supply node NODE_1 (shown in FIG. 2) of memory cell 200. Each conductive line of the set of conductive lines 1110 is coupled to a corresponding column of memory cells of first memory cell array 116 by a corresponding voltage supply node NODE_1 of each memory cell in the corresponding column of memory cells of first memory cell array 116 of FIG. 11. In some embodiments, set of conductive lines 1110 are configured to provide the voltage value of the second voltage source CVDD (shown in FIG. 9) to the first memory cell array 116.

By configuring a column or row of memory cells in memory macro 800 (FIG. 8) or memory macro 1100 (FIG. 11) as a set of retention circuits (e.g., set of retention circuits 808 or 1102), memory macro 800 or 1100 more accurately tracks bit cell retention leakage than other memory macro circuits. For example, set of retention circuits 808 of memory macro 800 or set of retention circuits 1102 of memory macro 1100 are made with a same process as that used to manufacture the memory cells in memory macro 800 or 1100, and therefore set of retention circuits 808 or 1102 are better able to track memory cells in memory macro 800 or 1100 than external logic circuits not made with the same process. For example, in some embodiments, by using SRAM cells to be configured as a retention circuit (e.g., set of retention circuits 808 or 1102), memory macro 800 (FIG. 8) or memory macro 1100 (FIG. 11) more accurately tracks bit cell retention leakage than other memory macro circuits. For example, in some embodiments, by replacing a set of edge cells (e.g., set of edge cells 802 or 1108) with a set of retention circuits (e.g., set of retention circuits 808 or 1102), memory macro 800 (FIG. 8) or memory macro 1100 (FIG. 11) more accurately tracks bit cell retention leakage than other memory macro circuits. A number of retention circuits (e.g., set of retention circuits 808, 1102) in memory macro 800 (FIG. 8) or memory macro 1100 (FIG. 11) is dynamically adjusted and yields a more flexible memory macro circuit (e.g., memory macro 800 or memory macro 1100) than other memory macro circuits.

Figure 12:
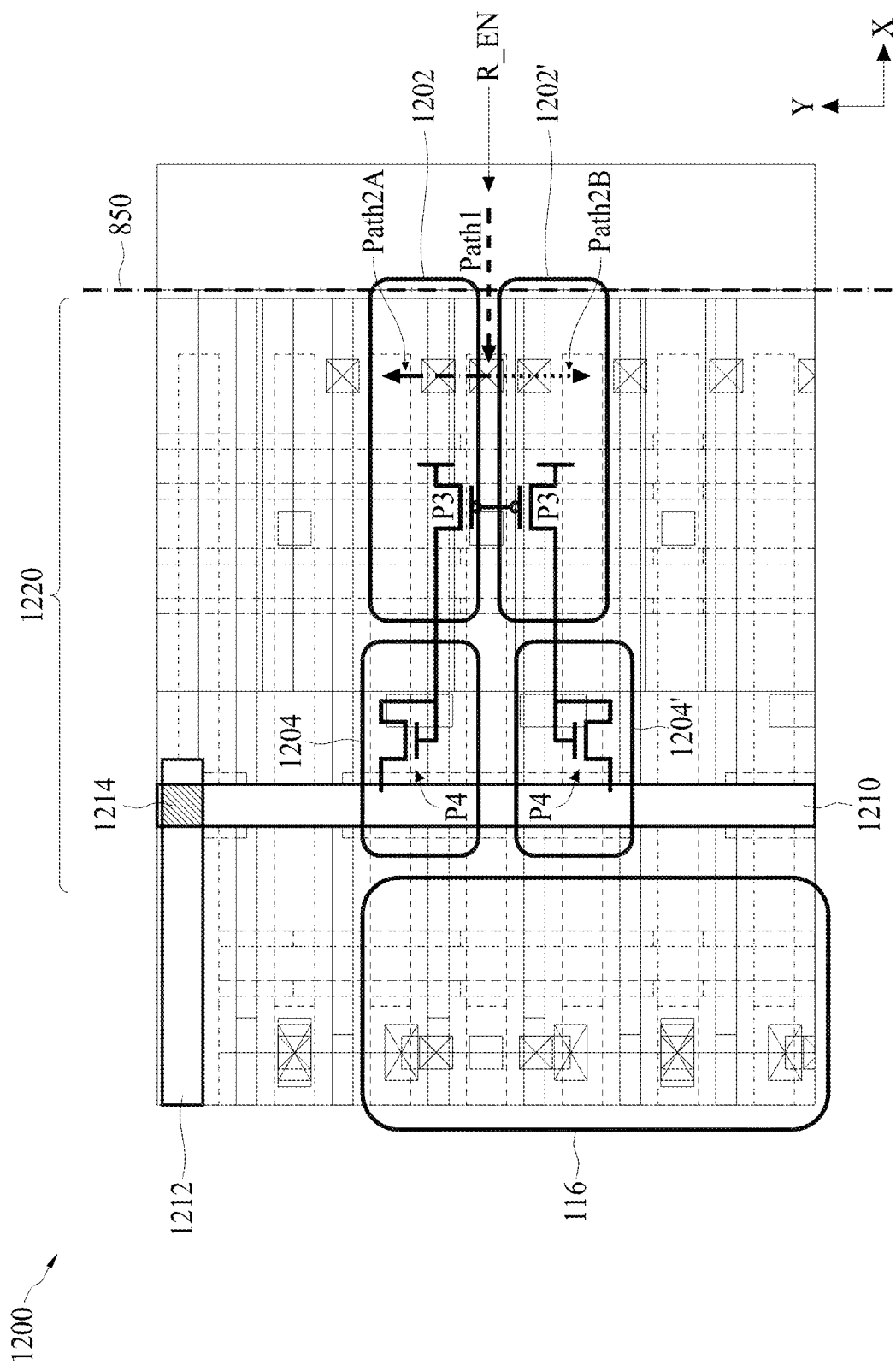
FIG. 12 is a portion of a layout diagram of a memory macro, in accordance with some embodiments.

FIG. 12 is a portion of a layout diagram of a memory macro 1200 usable in FIGS. 8 & 11, in accordance with some embodiments.

Memory macro 1200 includes first memory cell array 116, a transistor 1202, a transistor 1202', a diode 1204, a diode 1204', a first conductive line 1210, a second conductive line 1212 and a via 1214. Memory macro 1200 also includes other layout features (e.g., edge cells, memory cells or other metal layers) that are not described for simplicity.

Transistor 1202 or transistor 1202' is an embodiment of PMOS transistor P3 (FIG. 9). Diode 1204 or diode 1204' is an embodiment of diode 902 (FIG. 9) or diode 1000 (FIG. 10A). Column 1220 is an embodiment of column N+1 (FIG. 8). Components that are the same or similar to those in FIG. 1, 2 4A-4B or 8 are given the same reference numbers, and detailed description thereof is thus omitted.

Transistor 1202 and diode 1204 correspond to a retention circuit of the set of retention circuits 808 of FIG. 8. Transistor 1202' and diode 1204' correspond to a retention circuit of the set of retention circuits 808 of FIG. 8. Transistor 1202 or transistor 1202' is configured to receive control signal R_EN on path 1 and path 2A, 2B. In some embodiments, transistor 1202 or 1202' is a FinFET device having 4 fins or 2 fins. In some embodiments, diode 1204 or 1204' is a FinFET device having 2 fins or 1 fin. First conductive line 1210 is a portion of an embodiment of a conductive line of the set of conductive lines 810 (FIG. 8). Second conductive line 1212 is a portion of an embodiment of a conductive line of the set of conductive lines 810 (FIG. 8).

First conductive line 1210 extends in a first direction Y and is arranged in a column of memory macro 1200. First conductive line 1210 is located in a metal layer M0. Metal layer M0 is located below a metal layer M1. Metal layer M0 electrically connects a source terminal of diode 902 or 902' to other metal layers (e.g., metal layer M1, metal layer M2 (not shown), or metal layer M3 (not shown)). First conductive line 1210 is electrically connected to second conductive line 1212 by via 1214. First conductive line 1210 is a conductive material including copper, aluminum, nickel, titanium, tungsten or another suitable conductive material. In some embodiments, first conductive line 1210 includes one or more conductive line portions.

Second conductive line 1212 is located on metal layer M1. Second conductive line 1212 extends in a second direction X that is substantially perpendicular to the first direction Y. Second conductive line 1212 is a conductive material including copper, aluminum, nickel, titanium, tungsten or another suitable conductive material. In some embodiments, second conductive line 1212 includes one or more conductive line portions.

Via 1214 extends into and out of the page and is configured to provide an electrical connection between conductive layers on different levels of memory macro 1200. Via 1214 is located in one or more layers that are over or under a corresponding contact (not shown) or landing pad (not shown). Via 1214 is a conductive material including copper, aluminum, nickel, titanium, tungsten or another suitable conductive material. In some embodiments, via 1214 includes one or more conductive line portions.

Transistors 1202, 1202' and diodes 1204, 1204' are located in column 1220. Transistors 1202, 1202' and diodes 1204, 1204' are located along edge 850 of memory macro 1200. By configuring column 1220 of memory cells in memory macro 1200 (FIG. 12) as a set of retention circuits (e.g., transistors 1202, 1202' and diodes 1204, 1204'), memory macro 1200 more accurately tracks bit cell retention leakage than other memory macro circuits. For example, transistors 1202, 1202' and diodes 1204, 1204' of memory macro 1200 are made with a same process as that used to manufacture the memory cells in first memory cell array 116 in memory macro 1200, and therefore transistors 1202, 1202' and diodes 1204, 1204' are better able to track memory cells in memory macro 1200 than external logic circuits not made with the same process.

Figure 13:
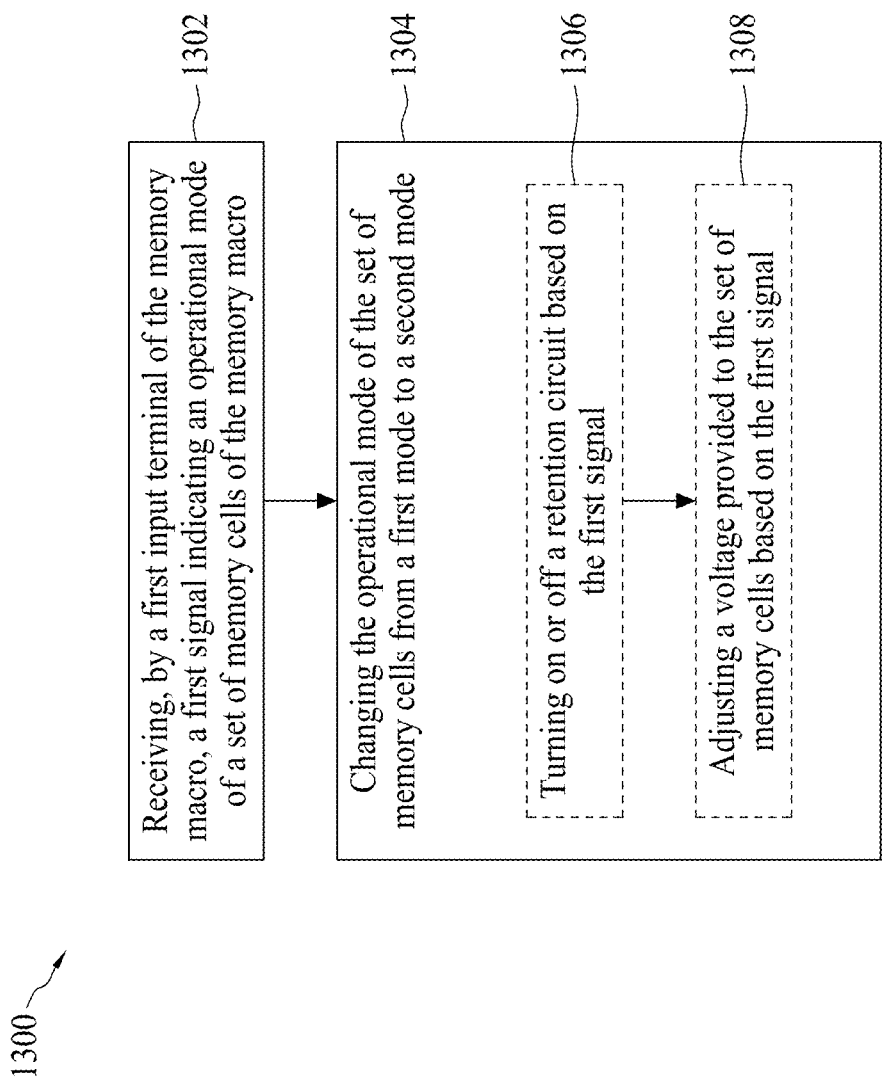
FIG. 13 is a flowchart of a method of operating a memory macro, such as the memory macro of FIG. 8 or FIG. 11, in accordance with some embodiments.

FIG. 13 is a flowchart of a method of operating a memory macro, such as the memory macro of FIG. 8 or FIG. 11, in accordance with some embodiments. It is understood that additional operations may be performed before, during, and/or after the method 1300 depicted in FIG. 13, and that some other processes may only be briefly described herein.

In operation 1302 of method 1300, a first input terminal (e.g., terminal 830 (FIG. 8) or terminal 1130 (FIG. 11)) of a memory macro (e.g., memory macro 800 (FIG. 8) or memory macro 1100 (FIG. 11)) receives a first signal (e.g., a control signal of the set of control signals R_EN (FIG. 8 or FIG. 11) or control signal EN1 (FIG. 9)) indicating an operational mode (e.g., sleep mode or active mode) of a set of memory cells (e.g. a row or column of cells in first memory cell array 116) of the memory macro (e.g., memory macro 800 (FIG. 8) or memory macro 1100 (FIG. 11)).

Method 1300 continues with operation 1304, where the operational mode (e.g., sleep mode or active mode) of the set of memory cells (e.g. a row or column of cells in first memory cell array 116) is changed from a first mode (e.g., sleep mode or active mode) to a second mode (e.g., active mode or sleep mode). In some embodiments, operation 1304 includes operation 1306 and operation 1308.

Method 1300 continues with operation 1306, where a retention circuit (e.g., retention circuit 808 (FIG. 8) or retention circuit 1102 (FIG. 11)) is turned on or off based on the first signal (e.g., a control signal of the set of control signals R_EN (FIG. 8 or FIG. 11) or control signal EN1 (FIG. 9)).

Method 1300 continues with operation 1308, where a voltage (e.g., a voltage of a first voltage source VDDI (FIG. 2) or a second voltage source CVDD (FIG. 9)) supplied to the set of memory cells (e.g. a row or column of cells in first memory cell array 116) is adjusted. In some embodiments, operation 1308 comprises adjusting a first voltage value supplied, by a first voltage source (first voltage source VDDI (FIG. 2)), to the set of memory cells (e.g. a row or column of cells in first memory cell array 116) and adjusting a second voltage value (e.g., voltage VN1 (FIG. 9)) supplied, by a second voltage source (e.g., second voltage source CVDD (FIG. 9)), to the set of memory cells (e.g. a row or column of cells in first memory cell array 116), the first voltage value differing from the second voltage value.

The retention circuit (e.g., retention circuit 808 (FIG. 8) or retention circuit 1102 (FIG. 11)) is part of the memory macro (e.g., memory macro 800 (FIG. 8) or memory macro 1100 (FIG. 11)). The retention circuit (e.g., retention circuit 808 (FIG. 8) or retention circuit 1102 (FIG. 11)) is coupled to the set of memory cells (e.g. a row or column of cells in first memory cell array 116) by a conductive line (e.g., conductive line 810 (FIG. 8) or conductive line 1110 (FIG. 11)), and at least one of the following configurations: (a) the set of memory cells (e.g. cells in first memory cell array 116) and the retention circuit (e.g., retention circuit 1102 (FIG. 11)) are arranged in a column of the memory macro (e.g., memory macro 1100 (FIG. 11)); or (b) the set of memory cells (e.g. cells in first memory cell array 116) and the retention circuit (e.g., retention circuit 808 (FIG. 8)) are arranged in a row of the memory macro (e.g., memory macro 800 (FIG. 8)).

Figure 14:
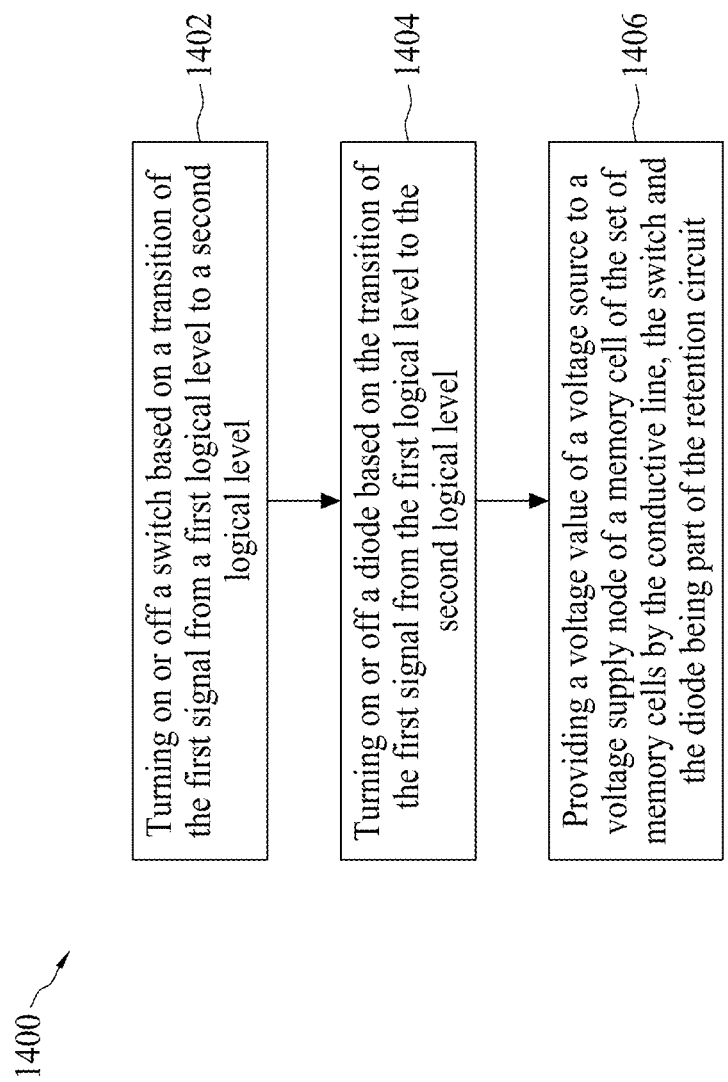
FIG. 14 is a flowchart of a method of turning on or off a retention circuit of a memory macro, in accordance with some embodiments.

FIG. 14 is a flowchart of a method of turning on or off a retention circuit of a memory macro, such as the memory macro of FIG. 8 or FIG. 11, in accordance with some embodiments. It is understood that additional operations may be performed before, during, and/or after the method 1400 depicted in FIG. 14, and that some other processes may only be briefly described herein. Method 1400 is an embodiment of operation 1306 of FIG. 13.

In operation 1402 of method 1400, a switch (e.g., PMOS transistor P3 (FIG. 9)) is turned on or off based on a transition of the first signal (e.g., a control signal of the set of control signals R_EN (FIG. 8 or FIG. 11) or control signal EN1 (FIG. 9)) from a first logical level to a second logical level.

Method 1400 continues with operation 1404, where a diode (e.g., diode 902 (FIG. 9), diode 1000 (FIG. 10A) or diode 1000' (FIG. 10B)) is turned on or off based on the transition of the first signal (e.g., a control signal of the set of control signals R_EN (FIG. 8 or FIG. 11) from the first logical level to the second logical level.

Method 1400 continues with operation 1406, where a voltage value (e.g., voltage VN1 (FIG. 9)) of a voltage source (e.g., second voltage source CVDD (FIG. 9)) is supplied to a voltage supply node (e.g., voltage supply node NODE_1 (FIG. 2) of a memory cell of the set of memory cells (e.g. a row or column of cells in first memory cell array 116) by the conductive line (e.g., conductive line 810 (FIG. 8) or conductive line 1110 (FIG. 11)). The switch (e.g., PMOS transistor P3 (FIG. 9)) and the diode (e.g., diode 902 (FIG. 9), diode 1000 (FIG. 10A) or diode 1000' (FIG. 10B)) are part of the retention circuit (e.g., retention circuit 808 (FIG. 8) or retention circuit 1102 (FIG. 11)).

One aspect of this description relates to a memory macro. The memory macro includes a first memory cell array, a first tracking circuit, a first transistor, and a second transistor. The first tracking circuit includes a first set of memory cells configured as a first set of loading cells responsive to a first control signal, a second set of memory cells configured as a first set of pull-down cells responsive to a second control signal, a first tracking bit line extending over the first tracking circuit, and being coupled to the first set of memory cells and the second set of memory cells. In some embodiments, the second control signal being inverted from the first control signal, and at least the first set of pull-down cells or the first set of loading cells being configured to track a memory cell of the first memory cell array. In some embodiments, the first transistor is coupled to the first tracking bit line. In some embodiments, the second transistor is coupled to the first tracking bit line. In some embodiments, the second transistor and the first transistor being configured to charge the first tracking bit line to a pre-charge voltage level responsive to a third control signal.

Another aspect of this description relates to a memory macro. The memory macro includes a first memory bank having a first memory cell array; a second memory bank having a second memory cell array; strap cells between the first memory bank and the second memory bank; a first set of memory cells configured as a first set of loading cells responsive to a first control signal; a second set of memory cells configured as a first set of pull-down cells responsive to a second control signal, the first set of pull-down cells and the first set of loading cells being configured to track a memory cell of the first memory cell array; a first tracking bit line extending in a first direction, being over at least the first memory bank, and being coupled to the first set of memory cells and the second set of memory cells; a second tracking bit line extending in the first direction, and being over the second memory bank; a first transistor coupled to the first tracking bit line, the first transistor configured to charge the first tracking bit line to a pre-charge voltage level responsive to a third control signal; and a second transistor coupled to the second tracking bit line, the second transistor configured to charge the second tracking bit line to the pre-charge voltage level responsive to a fourth control signal.

Yet another aspect of this description relates to a method of operating a memory macro. The method includes receiving a first control signal on a tracking word line; charging, by a first transistor and a second transistor, a tracking bit line to a pre-charge voltage level based on the first control signal, the first transistor and the second transistor being coupled to the tracking bit line; configuring a first set of memory cells as a first set of loading cells responsive to a second control signal; and configuring a second set of memory cells as a first set of pull-down cells responsive to a third control signal, the third control signal being inverted from the second control signal. In some embodiments, the tracking bit line is coupled to the first set of memory cells and the second set of memory cells.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. As such, the term source and drain are used interchangeably. Various signals are generated by corresponding circuits, but, for simplicity, the circuits are not shown.

Various figures show capacitive circuits using discrete capacitors for illustration. Equivalent circuitry may be used. For example, a capacitive device, circuitry or network (e.g., a combination of capacitors, capacitive elements, devices, circuitry, etc.) can be used in place of the discrete capacitor. The above illustrations include exemplary steps, but the steps are not necessarily performed in the order shown. Steps may be added, replaced, changed order, and/or eliminated as appropriate, in accordance with the spirit and scope of disclosed embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory macro comprising:
a first memory cell array;
a first tracking circuit comprising:
a first set of memory cells configured as a first set of loading cells responsive to a first control signal;
a second set of memory cells configured as a first set of pull-down cells responsive to a second control signal, the second control signal being inverted from the first control signal, at least the first set of pull-down cells or the first set of loading cells being configured to track a memory cell of the first memory cell array; and
a first tracking bit line extending over the first tracking circuit, and being coupled to the first set of memory cells and the second set of memory cells;
a first transistor coupled to the first tracking bit line; and
a second transistor coupled to the first tracking bit line, the second transistor and the first transistor being configured to charge the first tracking bit line to a pre-charge voltage level responsive to a third control signal.

2. The memory macro of claim 1, wherein the first tracking bit line comprises:
a first conductive line extending in a first direction, and being located on a first metal layer;
a second conductive line extending in a second direction different from the first direction, and being located on a second metal layer different from the first metal layer; and
a first via between the first conductive line and the second conductive line, and electrically coupling the first conductive line and the second conductive line.

3. The memory macro of claim 2, wherein the first tracking bit line further comprises:
a third conductive line extending in the first direction, and being located on the second metal layer; and
a second via between the first conductive line and the third conductive line, and electrically coupling the first conductive line and the third conductive line.

4. The memory macro of claim 3, wherein
the second conductive line is located along a first side of the memory macro and corresponds to a first terminal of the first tracking bit line; and
the third conductive line is located along a second side of the memory macro and corresponds to a second terminal of the first tracking bit line.

5. The memory macro of claim 3, wherein
the first metal layer corresponds to a metal zero (M0) layer, and
the second metal layer corresponds to a metal one (M1) layer.

6. The memory macro of claim 1, further comprising:
a tracking word line coupled to the first transistor and the second transistor; and
a tracking word line driver coupled to the tracking word line, and configured to generate the third control signal.

7. The memory macro of claim 1, wherein the first transistor comprises:
a first gate, a first drain, and a first source, wherein the first gate of the first transistor is configured to receive the third control signal, the first drain of the first transistor is coupled to a first end of the first tracking bit line, and the first source of the first transistor is coupled to a first voltage supply.

8. The memory macro of claim 7, wherein the second transistor comprises:
a second gate, a second drain, and a second source, wherein the second gate of the second transistor is configured to receive the third control signal, the second drain of the second transistor is coupled to a second end of the first tracking bit line, and the second source of the second transistor is coupled to the first voltage supply.

9. The memory macro of claim 1, wherein
the first set of memory cells configured as the first set of loading cells is adjusted to be configured as a second set of pull-down cells based on a transition of the first control signal from a first logical level to a second logical level different from the first logical level; and the second set of memory cells configured as the first set of pull-down cells is adjusted to be configured as a second set of loading cells based on a transition of the second control signal from the second logical level to the first logical level.

10. A memory macro comprising:
a first memory bank having a first memory cell array;
a second memory bank having a second memory cell array;
strap cells between the first memory bank and the second memory bank;
a first set of memory cells configured as a first set of loading cells responsive to a first control signal;
a second set of memory cells configured as a first set of pull-down cells responsive to a second control signal, the first set of pull-down cells and the first set of loading cells being configured to track a memory cell of the first memory cell array;
a first tracking bit line extending in a first direction, being over at least the first memory bank, and being coupled to the first set of memory cells and the second set of memory cells;
a second tracking bit line extending in the first direction, and being over the second memory bank;
a first transistor coupled to the first tracking bit line, the first transistor configured to charge the first tracking bit line to a pre-charge voltage level responsive to a third control signal; and
a second transistor coupled to the second tracking bit line, the second transistor configured to charge the second tracking bit line to the pre-charge voltage level responsive to a fourth control signal.

11. The memory macro of claim 10, further comprising:
a third set of memory cells configured as a second set of pull-down cells responsive to the fourth control signal; and
a fourth set of memory cells configured as a second set of loading cells responsive to a fifth control signal, the second set of pull-down cells and the second set of loading cells being configured to track a memory cell of the second memory cell array,
wherein the second tracking bit line is coupled to the third set of memory cells and the fourth set of memory cells.

12. The memory macro of claim 11, further comprising:
a third transistor coupled to the first tracking bit line, the third transistor configured to charge the first tracking bit line to the pre-charge voltage level responsive to the third control signal; and
a fourth transistor coupled to the second tracking bit line, the second transistor configured to charge the second tracking bit line to the pre-charge voltage level responsive to the fourth control signal.

13. The memory macro of claim 12, further comprising:
a first tracking word line coupled to the first transistor and the third transistor, and configured to receive the third control signal;
a second tracking word line coupled to the second transistor and the fourth transistor, and configured to receive the fourth control signal;
a first tracking word line driver coupled to the first tracking word line, and configured to generate the third control signal; and
a second tracking word line driver coupled to the second tracking word line, and configured to generate the fourth control signal.

14. The memory macro of claim 11, wherein
the first tracking bit line overlaps the first set of memory cells and the second set of memory cells; and
the second tracking bit line overlaps the first set of memory cells, the second set of memory cells, the third set of memory cells and the fourth set of memory cells.

15. The memory macro of claim 10, wherein
a number of cells of the first set of loading cells is adjustable responsive to the first control signal; and
a number of cells of the first set of pull-down cells is adjustable responsive to the second control signal.

16. The memory macro of claim 10, wherein a cell of the first set of memory cells or a cell of the second set of memory cells comprises:
a first transistor comprising:
a first terminal of the first transistor being coupled to a first control line, and configured to receive the first control signal or the second control signal;
a second terminal of the first transistor being coupled to the first tracking bit line, and
a third terminal of the first transistor being coupled to a first node; and
a second transistor comprising:
a first terminal of the second transistor being coupled to a first voltage supply;
a second terminal of the second transistor being coupled to the first node and the third terminal of the first transistor, and
a third terminal of the second transistor being coupled to the first voltage supply or a second voltage supply different from the first voltage supply.

17. A method of operating a memory macro, the method comprising:
receiving a first control signal on a tracking word line;
charging, by a first transistor and a second transistor, a tracking bit line to a pre-charge voltage level based on the first control signal, the first transistor and the second transistor being coupled to the tracking bit line;
configuring a first set of memory cells as a first set of loading cells responsive to a second control signal; and
configuring a second set of memory cells as a first set of pull-down cells responsive to a third control signal, the third control signal being inverted from the second control signal, and
the tracking bit line being coupled to the first set of memory cells and the second set of memory cells.

18. The method of claim 17, wherein charging, by the first transistor and the second transistor, the tracking bit line to the pre-charge voltage level comprises:
charging, by the first transistor and the second transistor, a first node of the tracking bit line and a second node of the tracking bit line to the pre-charge voltage level based on the first control signal, the first transistor being coupled to the first node of the tracking bit line, and the second transistor being coupled to the second node of the tracking bit line.

19. The method of claim 17, wherein configuring the second set of memory cells as the first set of pull-down cells responsive to the third control signal comprises:
pulling, by the second set of memory cells, a voltage level of the tracking bit line from the pre-charge voltage level toward a reference voltage of a reference voltage supply.

20. The method of claim 17, further comprising:
changing the configuration of the first set of memory cells from corresponding to the first set of loading cells to corresponding to a second set of pull-down cells based on a transition of the second control signal from a first logical level to a second logical level different from the first logical level; and changing the configuration of the second set of memory cells from corresponding to the first set of pull-down cells to corresponding to a second set of loading cells based on a transition of the third control signal from the second logical level to the first logical level.

\* \* \* \* \*